(12) United States Patent
Gray et al.

(10) Patent No.: US 10,664,098 B2
(45) Date of Patent: May 26, 2020

(54) CHANNEL DRIVER CIRCUIT

(71) Applicant: SIGMASENSE, LLC., Wilmington, DE (US)

(72) Inventors: Patrick Troy Gray, Cedar Park, TX (US); Phuong Huynh, Fairfax, VA (US)

(73) Assignee: SIGMASENSE, LLC., Wilmington, DE (US)

( * ) Notice: Subject to any disclaimer, the term of this patent is extended or adjusted under 35 U.S.C. 154(b) by 0 days.

(21) Appl. No.: 16/253,717

(22) Filed: Jan. 22, 2019

(65) Prior Publication Data

US 2019/0171331 A1    Jun. 6, 2019

Related U.S. Application Data

(63) Continuation-in-part of application No. 16/109,600, filed on Aug. 22, 2018, which is a continuation of
(Continued)

(51) Int. Cl.
*G06F 3/041* (2006.01)
*H03M 3/00* (2006.01)
(Continued)

(52) U.S. Cl.
CPC ........ *G06F 3/0416* (2013.01); *G06F 3/03545* (2013.01); *G06F 3/044* (2013.01);
(Continued)

(58) Field of Classification Search
CPC .. G06F 3/0416; G06F 3/04162; G06F 3/0418; G06F 3/03545; H03M 3/458
See application file for complete search history.

(56) References Cited

U.S. PATENT DOCUMENTS 6,218,972 B1    4/2001  Groshong
6,665,013 B1   12/2003  Fossum et al.
(Continued)

FOREIGN PATENT DOCUMENTS

CN    102455838 A    5/2012
CN    103995626 A    8/2014
(Continued)

OTHER PUBLICATIONS

Baker; How delta-sigma ADCs work, Part 1; Analog Applications Journal; Oct. 1, 2011; 6 pgs.
(Continued)

*Primary Examiner* — Laurence J Lee
(74) *Attorney, Agent, or Firm* — Garlick & Markison; Shayne X. Short

(57) ABSTRACT

A channel driver circuit includes a differential module and a driver module. In some examples, the channel driver circuit also includes a sigma-delta module. The differential module receives, via a single node of a load, a channel driving signal that is provided to the load at the single node (e.g., that is based on an electrical characteristic of the load) and generates an analog error signal that is based on the channel driving signal and a reference signal. The driver module is coupled to the differential module and generates the channel driving signal based on the analog error signal or a digital error signal corresponding to the analog error signal and transmits the channel driving signal via the single node to the load. The channel driver circuit simultaneously transmits the channel driving signal to the load at the single node and senses the channel driving signal at the single node.

20 Claims, 20 Drawing Sheets

Related U.S. Application Data application No. 15/506,097, filed as application No. PCT/US2016/038497 on Jun. 21, 2016, now Pat. No. 10,120,498.

(60) Provisional application No. 62/620,812, filed on Jan. 23, 2018, provisional application No. 62/630,595, filed on Feb. 14, 2018, provisional application No. 62/183,062, filed on Jun. 22, 2015.

(51) Int. Cl.
  G06F 3/044 (2006.01)
  G06F 3/0354 (2013.01)

(52) U.S. Cl.
  CPC ........ G06F 3/0418 (2013.01); G06F 3/04162 (2019.05); H03M 3/458 (2013.01); G06F 2203/04104 (2013.01)

(56) References Cited

U.S. PATENT DOCUMENTS

| | | | |
|---|---|---|---|
| 7,528,755 B2 | 5/2009 | Hammerschmidt | |
| 8,089,289 B1 | 1/2012 | Kremin et al. | |
| 8,279,180 B2 | 10/2012 | Hotelling et al. | |
| 8,547,114 B2 | 10/2013 | Kremin | |
| 8,587,535 B2 | 11/2013 | Oda et al. | |
| 8,625,726 B2 | 1/2014 | Kuan | |
| 8,982,097 B1 | 3/2015 | Kuzo et al. | |
| 2011/0063154 A1 | 3/2011 | Hotelling et al. | |
| 2011/0298745 A1 | 12/2011 | Souchkov | |
| 2012/0278031 A1 | 11/2012 | Oda | |
| 2013/0278447 A1 | 10/2013 | Kremin | |
| 2014/0327644 A1 | 11/2014 | Mohindra | |
| 2015/0091847 A1 | 4/2015 | Chang | |
| 2015/0346889 A1 | 12/2015 | Chen | |
| 2017/0115798 A1* | 4/2017 | Ho | G06F 3/0412 |

FOREIGN PATENT DOCUMENTS

| | | | |
|---|---|---|---|
| CN | 104182105 A | 12/2014 | |
| JP | 2000165774 A | 6/2000 | |
| KR | 20130050458 A | 5/2013 | |
| KR | 1020150055019 A | 5/2015 | |
| WO | 2014046711 A1 | 3/2014 | |

OTHER PUBLICATIONS

China National Intellectual Property Administration; Search Report; CN Application No. 201680002799.5; dated Aug 5, 2019; 2 pgs.
European Patent Office; Extended European Search Report; EP Application No. 16815134.8; dated Aug. 7, 2018; 12 pgs.
International Search Authority; International Search Report and Written Opinion; PCT/US2016/038497; dated Oct. 18, 2016; 14 pgs.

* cited by examiner

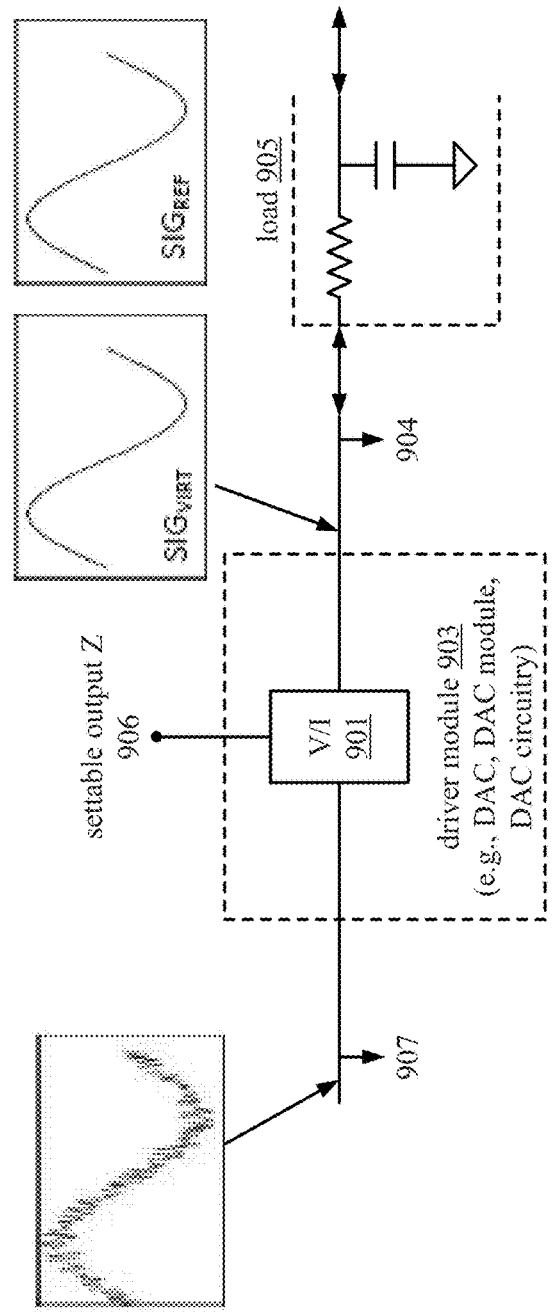
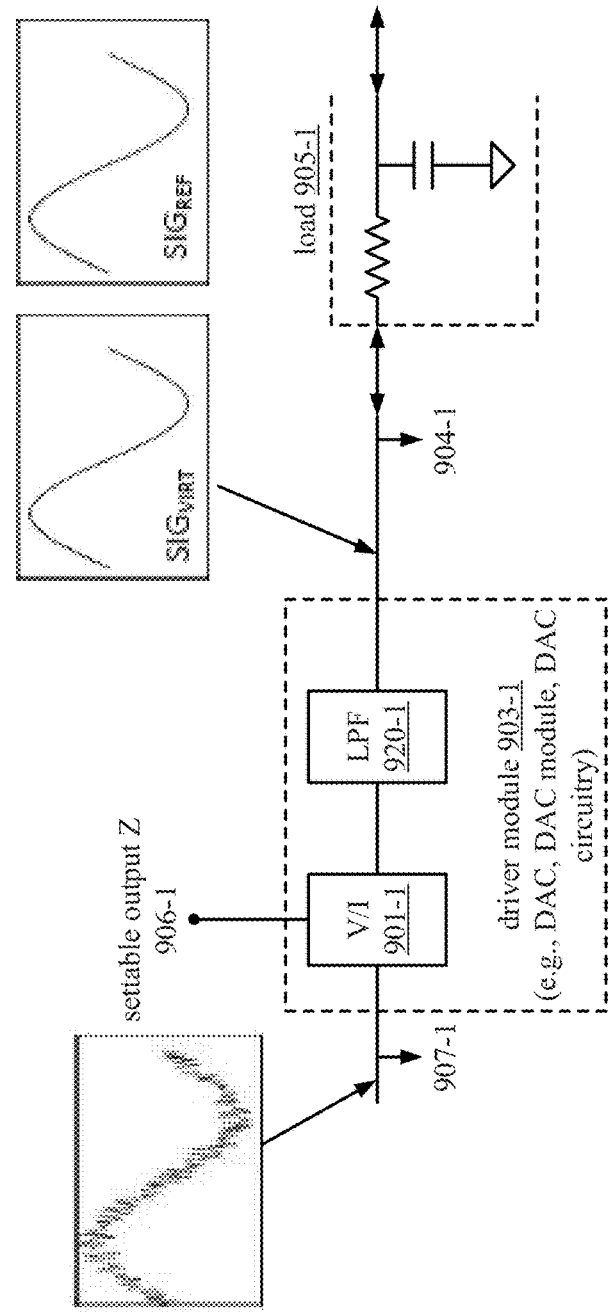
FIG. 9A
FIG. 9B

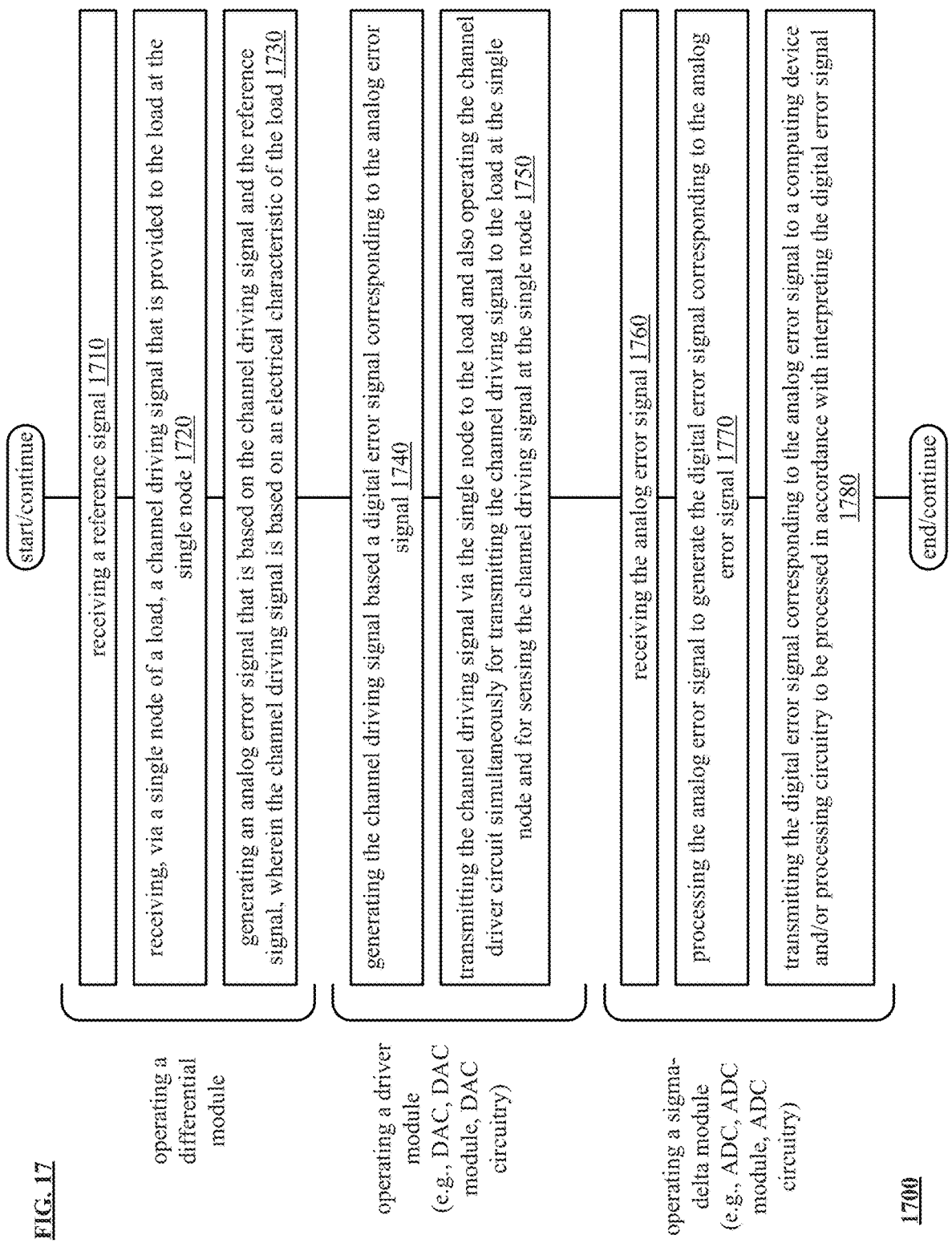

CHANNEL DRIVER CIRCUIT

CROSS REFERENCE TO RELATED PATENTS

The present U.S. Utility Patent Application claims priority pursuant to 35 U.S.C. § 119(e) to U.S. Provisional Application No. 62/620,812, entitled "CHANNEL DRIVER CIRCUIT," filed Jan. 23, 2018, and U.S. Provisional Application No. 62/630,595, entitled "ANALOG FRONT END CHANNEL DRIVER CIRCUIT," filed Feb. 14, 2018, all of which are hereby incorporated herein by reference in their entirety and made part of the present U.S. Utility Patent Application for all purposes.

The present U.S. Utility Patent Application also claims priority pursuant to 35 U.S.C. § 120, as a continuation-in-part (CIP) of U.S. Utility patent application Ser. No. 16/109,600, entitled "MULTI-TOUCH SENSOR AND ELECTROSTATIC PEN DIGITIZING SYSTEM UTILIZING SIMULTANEOUS FUNCTIONS FOR IMPROVED PERFORMANCE," filed Aug. 22, 2018, pending, which claims priority pursuant to 35 U.S.C. § 120 as a continuation of U.S. Utility application Ser. No. 15/506,097, entitled "MULTI-TOUCH SENSOR AND ELECTROSTATIC PEN DIGITIZING SYSTEM UTILIZING SIMULTANEOUS FUNCTIONS FOR IMPROVED PERFORMANCE," filed Feb. 23, 2017, now issued as U.S. Pat. No. 10,120,498 on Nov. 6, 2018, which is a U.S. National Stage Application submitted pursuant to 35 U.S.C. § 371 of Patent Cooperation Treaty Application No. PCT/US2016/038497, entitled "MULTI-TOUCH SENSOR AND ELECTROSTATIC PEN DIGITIZING SYSTEM UTILIZING SIMULTANEOUS FUNCTIONS FOR IMPROVED PERFORMANCE," filed Jun. 21, 2016, which claims priority pursuant to 35 U.S.C. § 119(e) to U.S. Provisional Application No. 62/183,062, entitled "MULTI-TOUCH SENSOR AND ELECTROSTATIC PEN DIGITIZING SYSTEM UTILIZING SIMULTANEOUS FUNCTIONS FOR IMPROVED PERFORMANCE," filed Jun. 22, 2015, all of which are hereby incorporated herein by reference in their entirety and made part of the present U.S. Utility Patent Application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to data communication systems and more particularly to sensed data collection and/or communication.

Description of Related Art

Sensors are used in a wide variety of applications ranging from in-home automation, to industrial systems, to health care, to transportation, and so on. For example, sensors are placed in bodies, automobiles, airplanes, boats, ships, trucks, motorcycles, cell phones, televisions, touch-screens, industrial plants, appliances, motors, checkout counters, etc. for the variety of applications.

In general, a sensor converts a physical quantity into an electrical or optical signal. For example, a sensor converts a physical phenomenon, such as a biological condition, a chemical condition, an electric condition, an electromagnetic condition, a temperature, a magnetic condition, mechanical motion (position, velocity, acceleration, force, pressure), an optical condition, and/or a radioactivity condition, into an electrical signal.

A sensor includes a transducer, which functions to convert one form of energy (e.g., force) into another form of energy (e.g., electrical signal). There are a variety of transducers to support the various applications of sensors. For example, a transducer is capacitor, a piezoelectric transducer, a piezoresistive transducer, a thermal transducer, a thermal-couple, a photoconductive transducer such as a photoresistor, a photodiode, and/or phototransistor.

A sensor circuit is coupled to a sensor to provide the sensor with power and to receive the signal representing the physical phenomenon from the sensor. The sensor circuit includes at least three electrical connections to the sensor: one for a power supply; another for a common voltage reference (e.g., ground); and a third for receiving the signal representing the physical phenomenon. The signal representing the physical phenomenon will vary from the power supply voltage to ground as the physical phenomenon changes from one extreme to another (for the range of sensing the physical phenomenon).

The sensor circuits provide the received sensor signals to one or more computing devices for processing. A computing device is known to communicate data, process data, and/or store data. The computing device may be a cellular phone, a laptop, a tablet, a personal computer (PC), a work station, a video game device, a server, and/or a data center that support millions of web searches, stock trades, or on-line purchases every hour.

The computing device processes the sensor signals for a variety of applications. For example, the computing device processes sensor signals to determine temperatures of a variety of items in a refrigerated truck during transit. As another example, the computing device processes the sensor signals to determine a touch on a touch screen. As yet another example, the computing device processes the sensor signals to determine various data points in a production line of a product.

Touchscreen devices correspond to another possible environment in which one or more sensors may be implemented. In certain touchscreen systems, projected capacitive touch sensors typically include a substrate upon which electrodes are disposed for sensing touch and a touch location. The substrate may be a durable glass having high optical transparency for viewing images displayed by an underlying display device that displays images such as graphical buttons and icons. When a user touches the device on the outer surface of the substrate at a location corresponding to a desired selection displayed on the display device (e.g., with a finger or a stylus), the location is determined by the device sensing changes in capacitances to and between the electrodes.

In some projected capacitive touch sensors, the electrodes are arranged in rows of electrodes and columns of electrodes. The rows and columns are typically electrically isolated from one another via an insulating layer. A touch location is determined by driving electrodes of a first orientation (e.g., the column electrodes or drive electrodes)

with a square wave signal (i.e., drive pulse). Sense circuitry coupled to the electrodes of the other orientation (e.g., the horizontal electrodes or sense electrodes) measures current flow between the electrodes due to mutual capacitive coupling that exists between the column electrodes and the row electrodes. The amount of current flow is directly proportional to the value of the mutual capacitance and therefore facilitates the determination of the mutual capacitance. The mutual capacitance between the intersection of a column electrode and a row electrode will change when a user touches the substrate in the vicinity of the intersection.

Typically, sense circuits for measuring the mutual capacitance operate by repetitively switching the sense electrodes to an input of an analog integrator circuit, which includes an amplifier with a feedback circuit that includes a capacitor that couples the amplifier output to the amplifier input. Such a circuit typically includes a switch that couples the input of the integrator to the sense electrode just before each falling edge of the drive pulse that drives the drive electrodes and then uncouples just before each rising edge so as to integrate only signals of one polarity. The output of the integrator is then digitized and the digitized value is utilized to determine whether and where a touch has occurred.

However, the relative magnitudes of parasitic capacitances of the switch at the input of the integrator are large in comparison with the mutual capacitances between electrodes, which are typically measured in fractions of a pico-farad. To overcome the adverse effects caused by the parasitic capacitances, a number of integration cycles may be performed before a touch location may accurately be determined. For example, the integrator may integrate the signal measured on the sense electrode over two hundred or more cycles, which could take 1 millisecond (ms) or more for a drive pulse with a frequency of 200 kilohertz (kHz). The length of time to make a determination increases with the number of electrodes that must be measured, which may adversely affect user experience for relatively large displays that typically have a large number of electrodes to measure, relative to smaller projected capacitive (pCap) displays used in mobile devices.

BRIEF DESCRIPTION OF THE SEVERAL VIEWS OF THE DRAWING(S)

FIG. 9A is a schematic block diagram of another embodiment of a driver module (e.g., which may be implemented as a DAC) in accordance with the present invention;

FIG. 9B is a schematic block diagram of another embodiment of a driver module (e.g., which may be implemented as a DAC) in accordance with the present invention;

FIG. 17 is a schematic block diagram of another embodiment of a method for execution by one or more devices in accordance with the present invention.

DETAILED DESCRIPTION OF THE INVENTION

Figure 1:
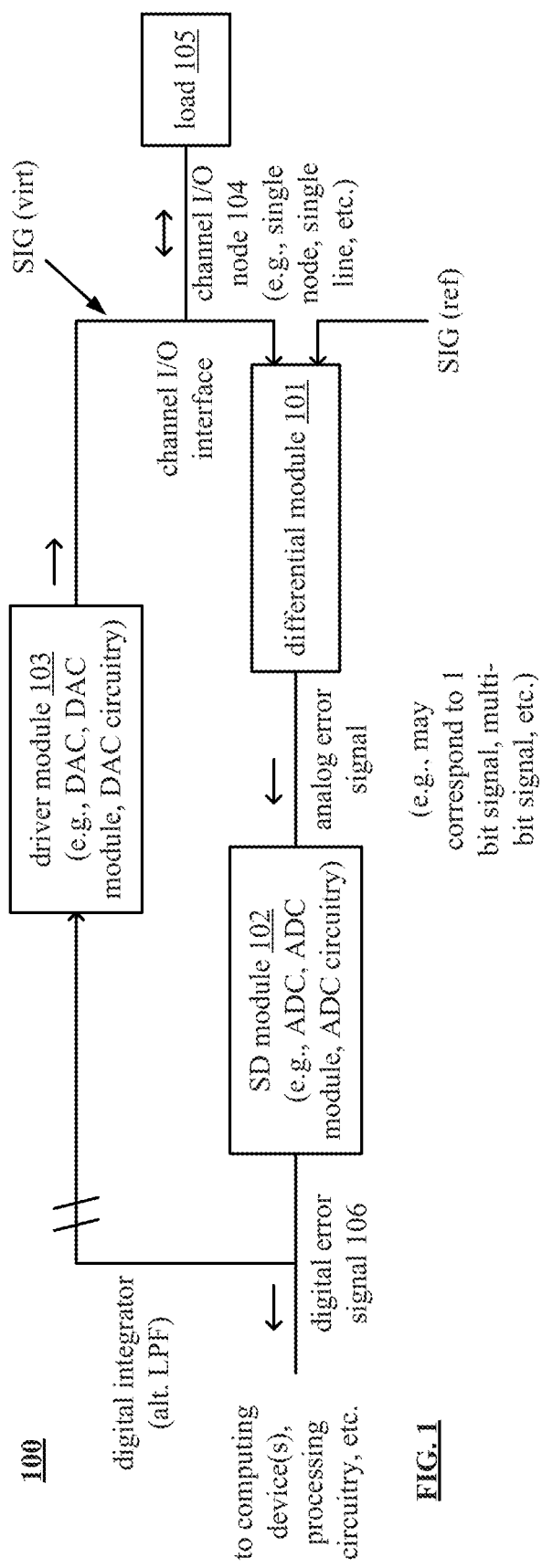
FIG. 1 is a schematic block diagram of an embodiment of a channel driver circuit in accordance with the present invention.

The present disclosure describes various aspects, embodiments, and/or examples of the invention (and/or their equivalents) of a channel driver circuit and related and associated circuitry, components, etc. such as may be used in accordance with any of a variety of applications including sensor applications, transducer applications, etc. For example, a channel driver circuit is implemented to employ a reference signal (e.g., such as may be provided from any circuitry, circuit, processing circuitry, component, device, etc. and may be in any of a variety of forms including an analog signal, a digital signal, etc.) and employ that reference signal to generate a low impedance virtual version of that reference signal that is driven onto, transmitted into, etc. a load (e.g., an external impedance network, a sensor, a transducer, an electrode of a touchscreen system, etc. and/or any desired electrical load) while simultaneously receiving and outputting the load-modified signal that is received from the load.

Note that the channel driver circuit is operative to detect any changes to the signal that is driven, transmitted, etc. to the load. For example, with respect to any signal that is driven and simultaneously detected by a channel driver circuit, note that any additional signal that is coupled into a line, an electrode, a touch sensor, a bus, a communication link, an electrical coupling or connection, etc. associated with that channel driver circuit is also detectable by the channel driver circuit. For example, a channel driver circuit that is associated with such a line, an electrode, a touch sensor, a bus, a communication link, an electrical coupling or connection, etc. is configured to detect any signal from one or more other lines, electrodes, a touch sensors, a buses, a communication links, electrical couplings or connections, etc. that get coupled into that line, electrode, touch sensor, bus, communication link, electrical coupling or connection, etc. Generally speaking, any change to the signal that is driven, transmitted, etc. to the load (e.g., such as based on an electrical characteristic or a change of an electrical characteristic of the load such as due to the load itself, modification to the load, and/or any one or more externally injected signals) may be sensed, detected, etc. by the channel driver circuit).

The channel driver circuit operates by providing functionality including low impedance transmitting with a high impedance receiving while the external transmitting source signal effectively sees a ground terminated load. In some examples, the channel drive circuit is configured to subtract the reference signal and output only the load-affected signal information (e.g., as driven and/or as received).

In some examples, certain characteristics of a channel driver circuit may be implemented to operate as a DAC to output signals and an ADC to process at the channel signal properties while offering low output impedance and high input impedance to received signals at the analog channel node (e.g., where the channel driver circuit couples and/or connects to the load) while shaping the noise (e.g., moving noise from the pass band portion of the signal range to a different frequency spectrum of the signal, such as to a higher frequency range) at the analog channel node and digital output node. In some examples, a channel driver circuit is implemented to generate a digital output signal and also has the ability to incorporate these analog driving, measuring, sensing properties with noise shaping properties.

Generally speaking, noise shaping may be viewed as moving noise from a frequency region of interest (e.g., "the pass band" portion of the signal range) to a different frequency portion of the signal spectrum (e.g., oftentimes located at a higher frequency range). Tis may be achieved using oversampling and error integration such that the, where it can be removed through filtering practices thus lowering the noise floor. In some examples, a first order noise shaping effectively provides a slope of minus 20 dB per decade of noise reduction as one approaches the signal of interest, for example. A second order would be minus 40 dB per decade and so on to higher orders, for example. The general starting point of the slope is dependent on many factors such as the oversampling ration and the resolution of the analog to digital converter.

FIG. 1 is a schematic block diagram of an embodiment 100 of a channel driver circuit in accordance with the present invention. The channel driver circuit includes a differential module 101 coupled to a sigma-delta (SD) module 102. In some examples, note that the SD module 102 may be implemented as an analog to digital converter (ADC), an ADC module, ADC circuitry, etc. Note that the differential module 101 may be implemented as a differential amplifier that is configured to receive a signal reference (SIG (ref)) at one input. The channel driver circuit further includes a driver module 103 that forms an outer loop feedback from the output of the SD module 103 at a digital output node 106 to the differential module 101. In some examples, note that the driver module 103 may be implemented as a digital to analog converter (DAC), a DAC module, DAC circuitry, etc.

In some examples, the driver module 103 is configured to provide a variable power output to a channel input/output (IO) node 104 (e.g., via a channel I/O interface) to drive an analog signal at a desired current or voltage to a load 105. In some examples, note that the channel I/O node 104 is a single node, a single line, a single-ended line, etc. Note that the load 105 may be of any of a variety of types of electrical loads including an electrode of a touchscreen, a sensor, a transducer, a device, an integrated circuit, circuitry, a computer, a tablet, a smart phone, an appliance, a motor, etc. and/or any other type of electrical load. The driver module 103 receives a digital error signal from the SD module 102 and reconstructs the error signal into an analog format substantially similar to SIG (ref), this reconstructed signal is a virtualized version of the SIG (ref) signal (SIG (virt)).

In some examples, the digital error can have 1-to-M number of bits, where M is an integer≥2. Thus, the channel driver circuit has an analog I/O at the channel I/O node 104 and a digital output at the digital output node 106. In operation, the SD module 102 performs an analog-to-digital conversion and the driver module 103 performs a digital-to-analog conversion. The differential module 101 creates an analog error signal from the difference between the SIG (ref) and the SIG (virt) signals. The analog error signal is passed to the SD module 102.

In some examples, the differential module 101 and the SD module 102 are configured to operate as a digital op-amp with input and feedback impedance networks. This implementation facilitates controllable impedance, gain, current-to-voltage function, a channel driving signal, and voltage following. Further, the merging of function of DAC, digital op-amp, ADC feedback and I/O impedance allows for gain differences at different frequency ranges. In various embodiments, a self-capacitive mode of a touch screen device has a low gain requirement as it has a large signal response, a mutual-capacitive mode transmit of a touch screen device has low gain requirement as it is not usually demodulated (the change measured to see mutual from transmit row to row), and a mutual-capacitive mode receive of a touchscreen device has a higher gain requirement for the mutual frequency band or receive (the change measured on the receive line column) and the receiving channel may not have to transmit large signals allowing headroom for increased gain.

The channel I/O node 104 is a node coupled to the driver module 103, an input of the differential module 101, and the load 105. The load 105 can be an analog device, such as any device or circuit capable of receiving and/or transmitting an analog signal to the channel driver circuit, or an impedance network where changes to the network impedance are to be measured. For example, the analog device may be a touchscreen or a touchscreen interface network circuit, which is an impedance network typically formed of resistances and capacitances, where an analog signal is driven to the touch screen and a returning analog signal or change to the driven signal can indicate whether a touch event has occurred. The channel driver circuit can also be used in applications with zero resistance sensors (wires), high frequency (HF) sensing using channel driver frequency greater than 1 megahertz (MHz) for the transmission and reception of HF signals using modulating sigma-delta, a spectrum analyzer, or as a network analyzer.

The signal present at the channel I/O node 104 may be referred to as a channel driving signal or SIG (virt). This signal is driven by the system to act as a virtual version of SIG (ref). In some examples, the channel driving signal includes the analog output signal SIG (virt) generated by the driver module 103 onto the load 105 and any signal sourced from the load 105 will be zeroed as a signal into a virtual ground.

In some examples, the differential amplifier in the differential module 101 has a first input port coupled to the channel I/O node 104 and a second input node receiving a reference signal SIG (ref). SIG (ref) is a reference signal desired to be output to the load 105 after being processed by the channel driver circuit. The differential module 101 compares and amplifies the difference between SIG (ref) and the SIG (virt) in order to generate an analog error signal. The analog error signal from the differential module 101 is then provided to an input of the SD module 102.

The differential module 101 can be implemented in a variety of ways. For example, different implementations may be used and selected based on any number of considerations including desired performance/attributes/characteristics.

In an example of operation and implementation, a channel driver circuit includes a differential module (e.g., such as differential module 101), a driver module (e.g., such as driver module 103), and a sigma-delta module (e.g., such as SD module 102). The differential module is configured to receive a reference signal. The differential module is also configured to receive, via a single node of a load, a channel driving signal that is provided to the load at the single node. The differential module is also configured to generate an analog error signal that is based on the channel driving signal and the reference signal. Note that the channel driving signal is based on an electrical characteristic of the load, and The driver module is coupled to the differential module and configured to generate the channel driving signal based on a digital error signal corresponding to the analog error signal. The driver module is also configured to transmit the channel driving signal via the single node to the load. Note that the driver module includes a voltage to current converter circuitry configured to generate the channel driving signal based on the digital error signal corresponding to the analog error signal.

The sigma-delta module is coupled to the differential module and configured to receive the analog error signal. The sigma-delta module is also configured to process the analog error signal to generate the digital error signal corresponding to the analog error signal. The sigma-delta module is also configured to transmit the digital error signal corresponding to the analog error signal to a computing device and/or processing circuitry to be processed in accordance with interpreting the digital error signal corresponding to the analog error signal. note that the channel driver circuit is configured simultaneously to transmit the channel driving signal to the load at the single node and to sense the channel driving signal at the single node.

In some examples, the differential module includes a differential amplifier having a first input port configured to receive the channel driving signal, a second input port configured to receive the reference signal, and an output port configured to output the analog error signal. Also, the sigma-delta module includes an analog to digital converter (ADC) configured to process the analog error signal to generate the digital error signal corresponding to the analog error signal. In addition, the driver module includes a digital to analog converter (DAC) configured to generate the channel driving signal based on the digital error signal corresponding to the analog error signal.

In other examples, the sigma-delta module includes a comparator configured to receive the analog error signal and to process the analog error signal to generate the digital error signal corresponding to the analog error signal. The sigma-delta module also includes a flip-flop circuit configured to store the digital error signal at least temporarily before transmitting the digital error signal corresponding to the analog error signal to the computing device and/or processing circuitry to be processed in accordance with interpreting the digital error signal.

In addition, in other examples, the differential module includes a differential amplifier having a first input port configured to receive the channel driving signal, a second input port configured to receive the reference signal via a resistor, and an output port that is coupled to the second input port via another resistor and/or a capacitor and is configured to output the analog error signal. Note that the analog error signal is output from the differential amplifier as a single-ended analog error signal or a differential analog error signal.

Note that the load may be of any of a variety of types including any one or more of an electrode of a touchscreen, a sensor, a transducer, a device, an integrated circuit, circuitry, a computer, a tablet, a smart phone, an appliance, or a motor.

FIGS. 2A-2D illustrate examples of possible embodiments of the differential module 101. Each of the embodiments shown in FIGS. 2A-2D illustrate different respective implementations of a differential module including a differential amplifier configured to receive a first input signal at a first input port 202 and a second input signal at a second input port 203, and generate an analog error signal at output 204.

Figure 2A:
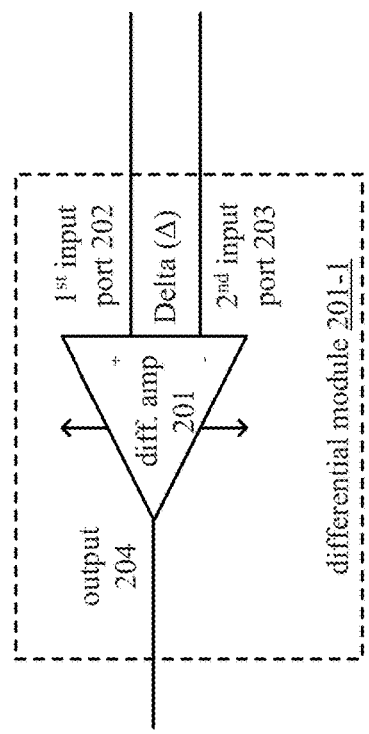
FIG. 2A is a schematic block diagram of an embodiment of a differential module in accordance with the present invention.

FIG. 2A is a schematic block diagram of an embodiment 201-1 of a differential module in accordance with the present invention. This diagram illustrates the differential amplifier 201 generating a single ended analog error signal at the output 204.

Figure 2B:
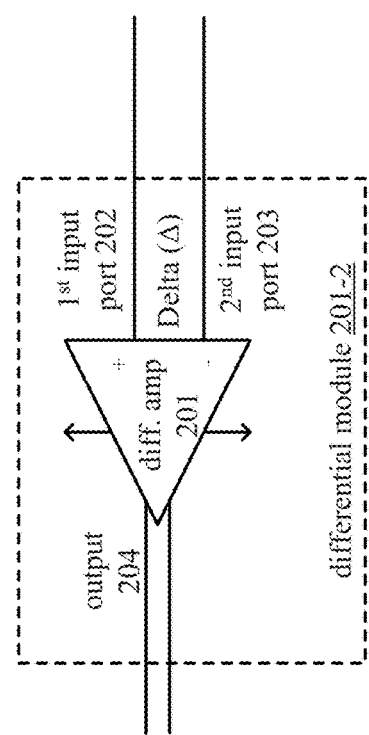
FIG. 2B is a schematic block diagram of another embodiment of a differential module in accordance with the present invention.

FIG. 2B is a schematic block diagram of another embodiment 201-2 of a differential module in accordance with the present invention. This diagram illustrates the differential amplifier 201 generating a differential analog error signal at the output 204.

Figure 2C:
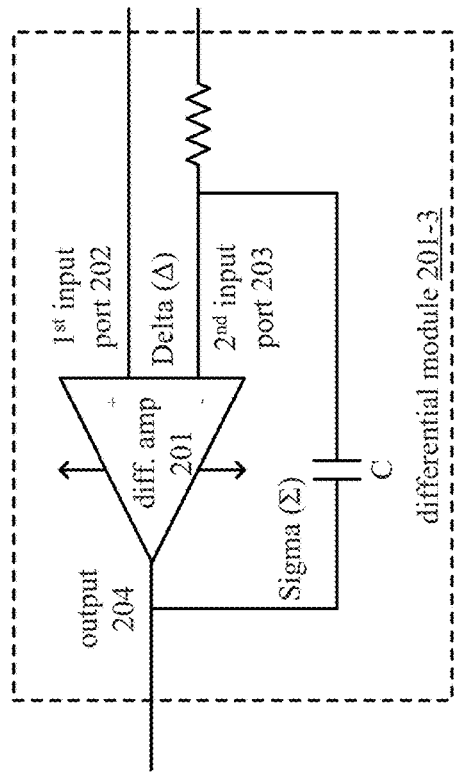
FIG. 2C is a schematic block diagram of another embodiment of a differential module in accordance with the present invention.

FIG. 2C is a schematic block diagram of another embodiment 201-3 of a differential module in accordance with the present invention. This diagram illustrates the differential amplifier 201 further including a capacitor C implemented to operate as an integrator and coupled between the output 204 and the second input port 203.

Figure 2D:
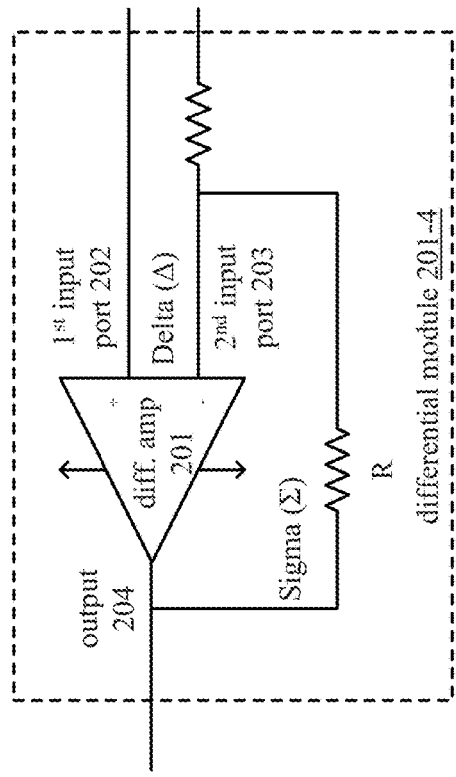
FIG. 2D is a schematic block diagram of another embodiment of a differential module in accordance with the present invention.

FIG. 2D is a schematic block diagram of another embodiment 201-4 of a differential module in accordance with the present invention. This diagram illustrates the differential amplifier 201 further including a resistor 206 acting as a gain setting feedback and coupled between the output 204 and the first input port 202.

In the embodiments illustrated in FIGS. 2A-2D, the negative terminal of the differential amplifier can be configured to receive SIG (ref) and the positive terminal of the differential amplifier can be configured to receive the channel driving signal SIG (virt). Conversely, the positive terminal of the differential amplifier can be configured to receive the channel driving signal SIG (ref) and the negative terminal of the differential amplifier can be configured to receive SIG (ref), where correcting inversion can be accomplished in other analog or digital parts of the circuit. The differential module 101 may include one or more inverters to invert various signals as needed in a particular implementation. In alternative embodiments, the differential module 101 is implemented to include a combination of circuit functions as described herein or their equivalents.

Figure 3A:
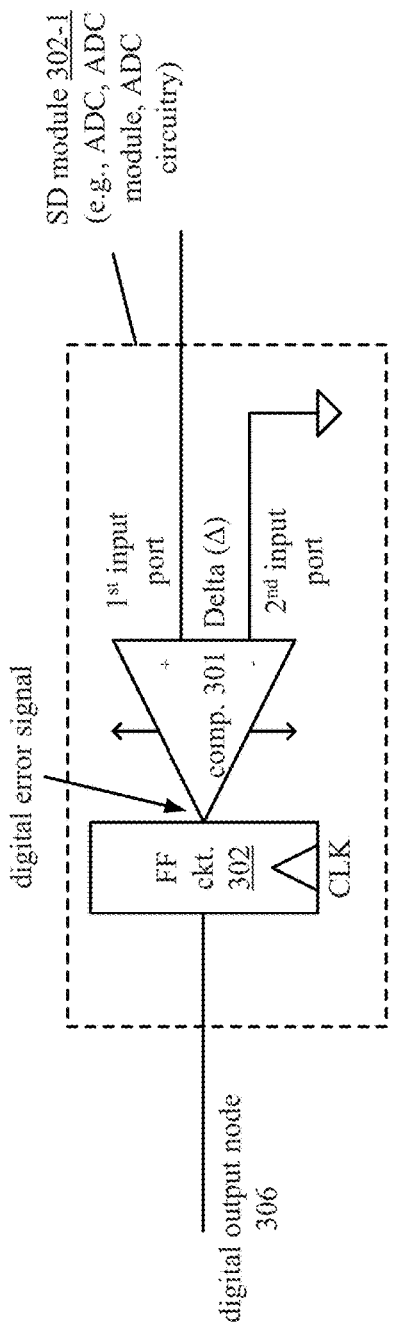
FIG. 3A is a schematic block diagram of an embodiment of a sigma-delta module (e.g., which may be implemented as an analog to digital converter (ADC)) in accordance with the present invention.

FIG. 3A is a schematic block diagram of an embodiment of a sigma-delta module (e.g., which may be implemented as an analog to digital converter (ADC)) in accordance with the present invention. In some examples, an SD module such as described herein is implemented using sigma-delta modulation techniques. In various embodiments and with reference to FIG. 3A, the SD module 302-1 can include a 1-bit ADC with latch including a comparator 301 and a flip-flop circuit 302. The flip-flop circuit 302 stores the 1-bit output from the comparator 301. The comparator converts the analog error signal into a digital error signal that is provided to the driver module 103 and also provided as a digital output signal at the digital output node 106 of the channel driver circuit. The digital error digital error signal can be further processed to determine the spectral content of the channel drive signal SIG (virt). The channel driver circuit in this configuration produces first order noise shaping. Furthermore, the SD module 302-1 can be implemented as a multi-bit ADC.

Figure 3B:
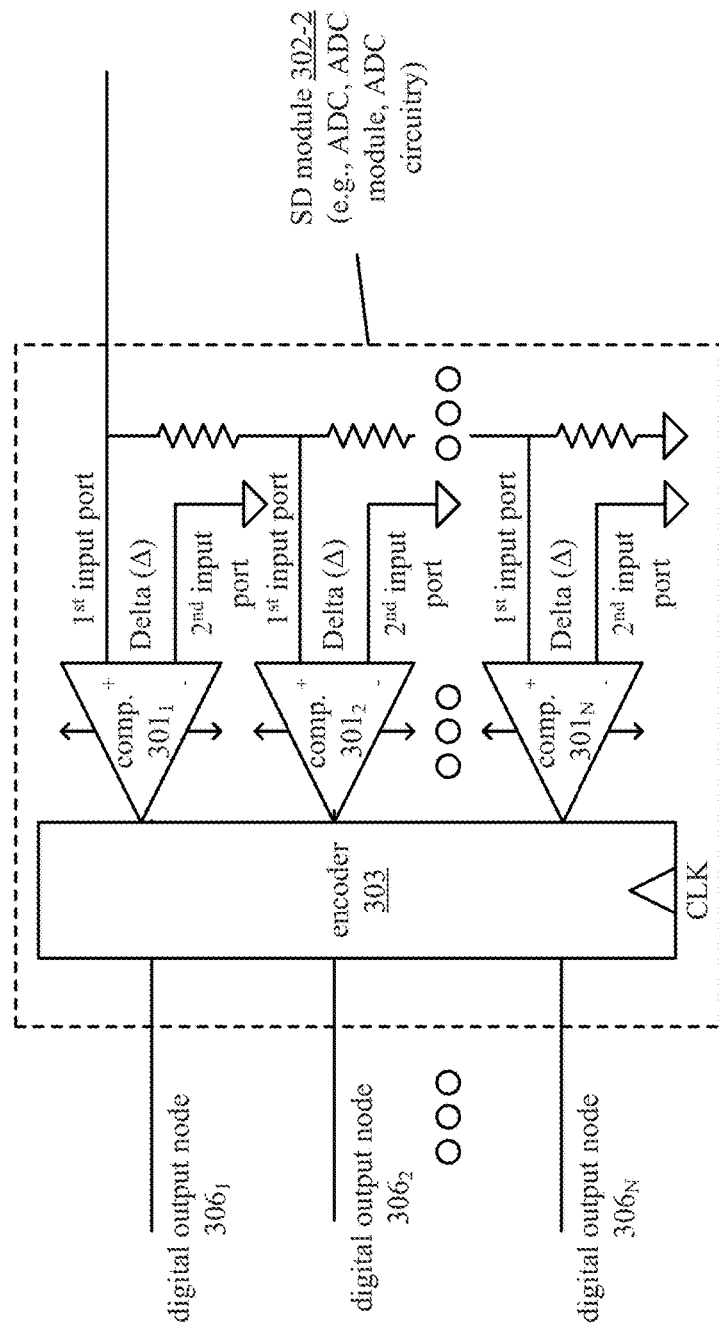
FIG. 3B is a schematic block diagram of another embodiment of a sigma-delta module (e.g., which may be implemented as an ADC) in accordance with the present invention.

FIG. 3B is a schematic block diagram of another embodiment of a sigma-delta module (e.g., which may be implemented as an ADC) in accordance with the present invention. FIG. 3B illustrates SD module 302-2 including a multi-bit ADC including multiple comparators $301_1$, $301_2 \ldots 301_N$ coupled to an encoder 303. The encoder 303 receives signals 1-N from the multiple comparators $301_1$, $301_2 \ldots 301_N$ and provides multiple digital output signals $306_1, 306_2 \ldots 306_N$ at the digital output node.

Figure 3C:
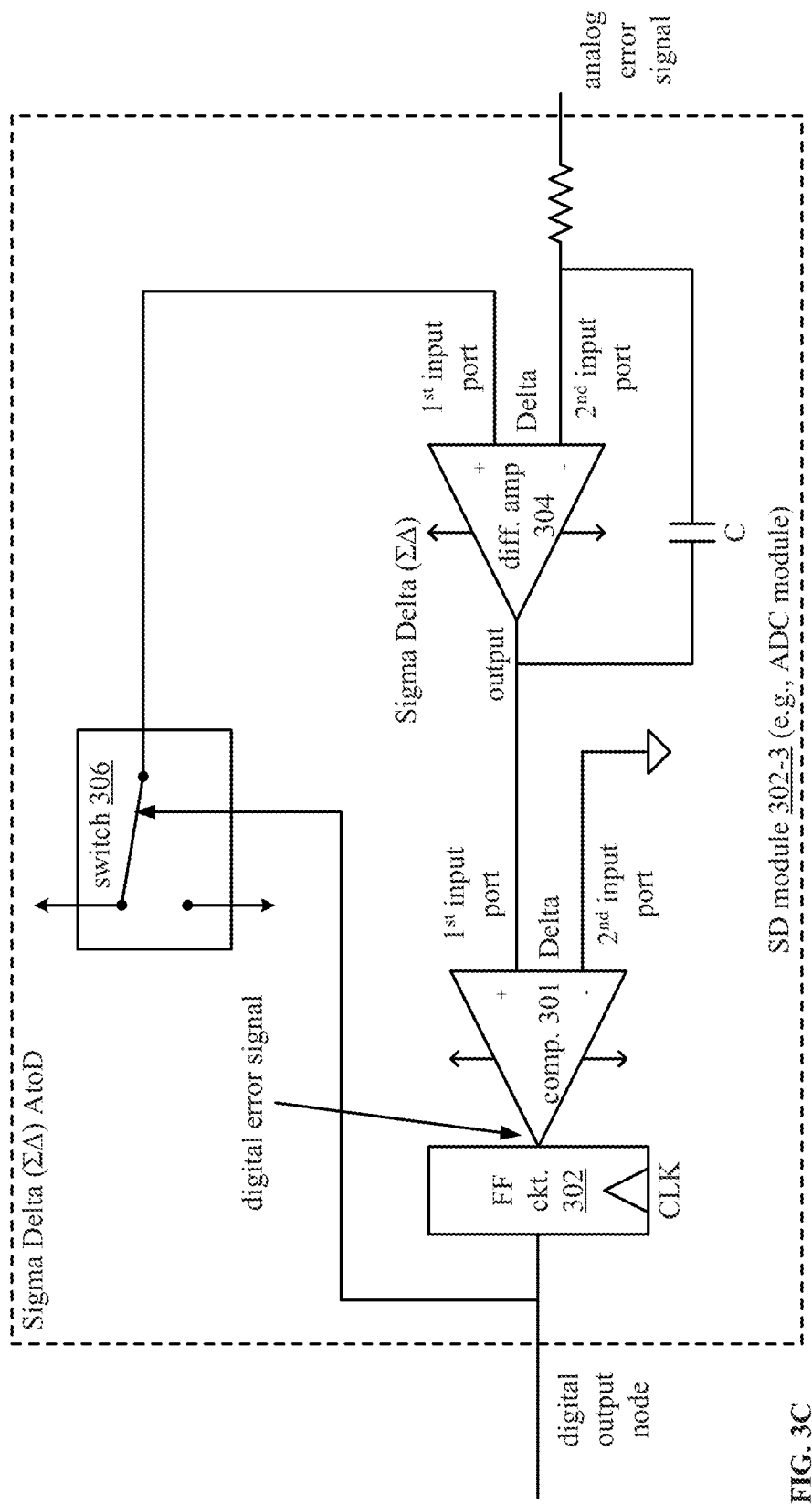
FIG. 3C is a schematic block diagram of another embodiment of a sigma-delta module (e.g., which may be implemented as an ADC) in accordance with the present invention.

FIG. 3C is a schematic block diagram of another embodiment of a sigma-delta module (e.g., which may be implemented as an ADC) in accordance with the present invention.

FIG. 3C illustrates a $1^{st}$ order SD module yielding a $2^{nd}$ order circuit, where the SD module 302-2 includes a differential amplifier 304, a capacitor C, a comparator 301, a flip-flop circuit 302, and a switch 306. The capacitor 305 is implemented to operate as an integrator coupled between an input and the output of the differential amplifier 304. Further, the differential amplifier 304 provides a modulated analog error signal to the comparator 301.

In this implementation, the comparator 301 and flip-flop circuit 302 forms a 1-bit ADC with latch, with the flip-flop circuit 302 storing the 1-bit output from the comparator 301. The 1-bit output forms a digital signal as an output signal, which also controls the switch 306. The comparator 301 is configured to compare the modulated error signal of the differential amplifier 304 and a reference signal to generate a digital error signal. If the analog error signal has increased in comparison to a reference signal (e.g., shown as signal ground in FIG. 3C), the comparator 301 generates a one ("1"). If the analog error signal has decreased, the comparator 301 generates a zero ("0"). As such, the SD ADC is configured to transmit the changes in, or the gradient of, the analog error signal. The flip-flop circuit 302 stores the 1-bit output from the comparator 301. The 1-bit output forms a digital shaped noise spectrum waveform as an output signal, which also controls the switch 306. The switch (e.g., which may be implemented as a feedback DAC) controls whether the high or low reference voltage is connected to the second input of the amplifier 304. The switch 306 is connected to the high reference voltage when the flip-flop circuit 302 has a one ("1") value and is connected to the low reference voltage when the flip-flop circuit 302 has a zero ("0") value, or vice versa. The high or low level is subtracted from the incoming signal to the amplifier 304 from a differential module, and the difference is integrated on capacitor C thus the SD module 302-2 is configured to track the average error and converts the incoming signal into a digital pulse stream.

Figure 3D:
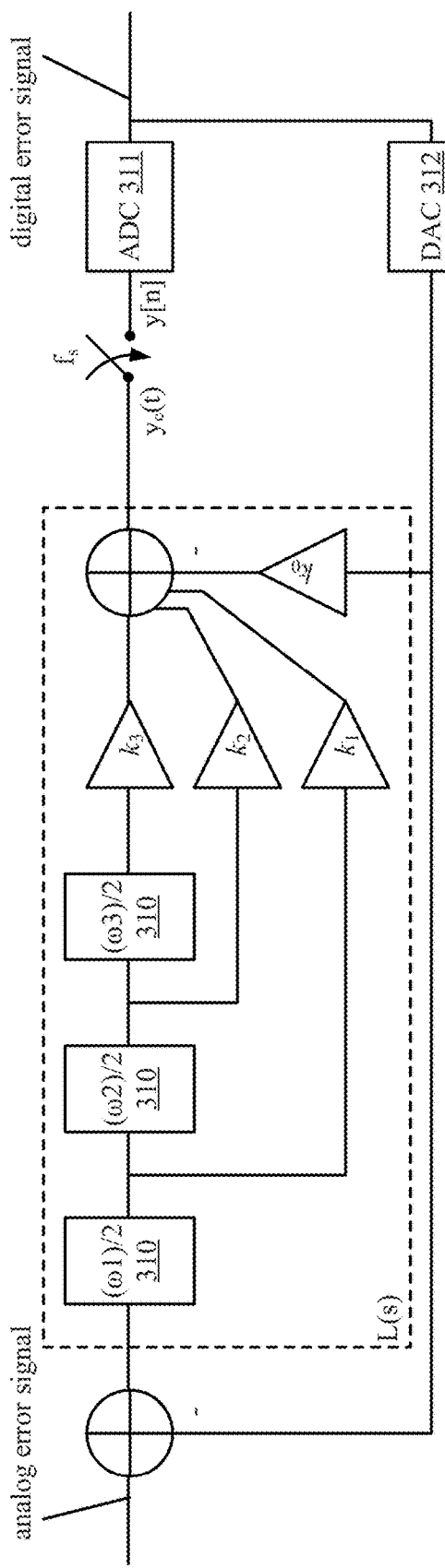
FIG. 3D is a schematic block diagram of another embodiment of a sigma-delta module (e.g., which may be implemented as an ADC) in accordance with the present invention.

FIG. 3D is a schematic block diagram of another embodiment of a sigma-delta module (e.g., which may be implemented as an ADC) in accordance with the present invention.

Figure 3E:
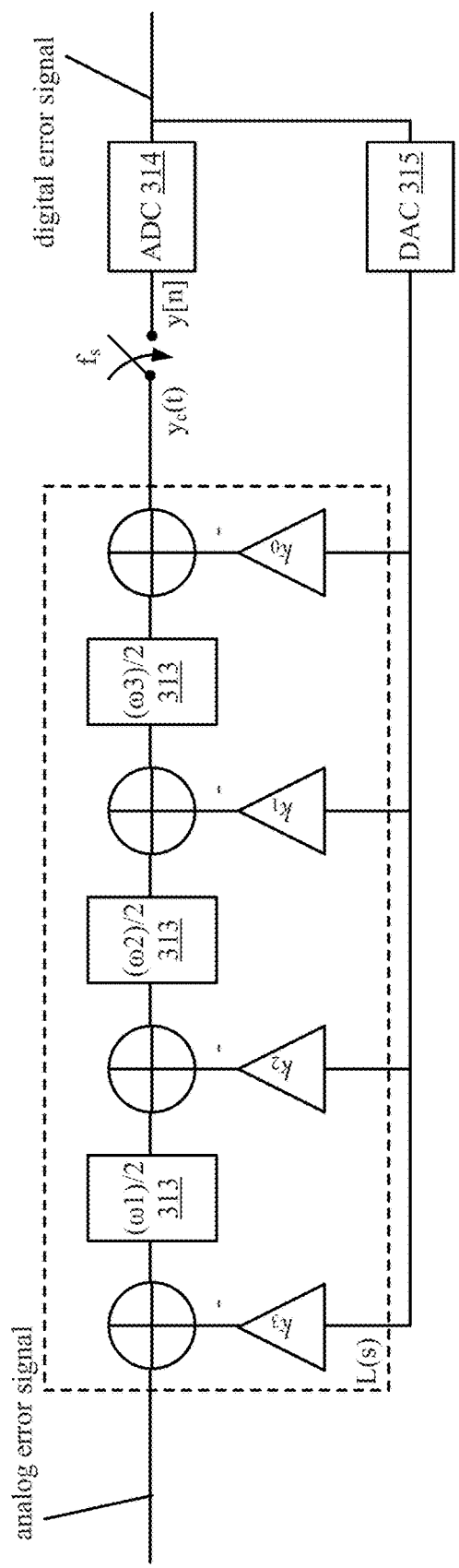
FIG. 3E is a schematic block diagram of another embodiment of a sigma-delta module (e.g., which may be implemented as an ADC) in accordance with the present invention.

FIGS. 3D-3E show multi-order SD modules, where an M order module yields an M+1 shaping order when integrated into a channel driver circuit (e.g., such as may be implemented in accordance with FIG. 1). FIG. 3D illustrates a SD module including a cascade of integrators 310 with feedforward summation (CIFF) coupled to an ADC 311, with a DAC 312 in a feedback connection.

FIG. 3E is a schematic block diagram of another embodiment of a sigma-delta module (e.g., which may be implemented as an ADC) in accordance with the present invention.

Similarly, FIG. 3E illustrates a SD module including a cascade of integrators 313 with distributed feedback (CIFB) coupled to an ADC 314, with a DAC 315 in a feedback connection.

In some examples, an SD module may be implemented to include one or more integrators located before a comparator (e.g., one or more integrators 310 located before a comparator 301 such as in certain of the prior diagrams). For example, consider the comparator 301 being coupled to an output of an integrator, where the comparator 301 compares a modulated error signal of the integrator and a reference signal to generate an output error signal.

If the analog error signal has increased in comparison to reference signal (ground as shown in FIGS. 3D-3E), then the comparator 301 generates a one ("1"). If the analog error signal has decreased, the comparator 301 generates a zero ("0"). As such, the SD module is configured to transmit the changes in, or the gradient of, the analog error signal. The integrator acts as a low pass filter (LPF) and shapes the noise in the analog error signal so that the noise may be filtered off. The integrator can be configured to perform forced modulation (e.g., noise shaping) of the amplified error signal to move noise from low to high frequencies of the error signal and generate the modulated error signal. The SD module may include multiple integrators, which may be implemented for a higher order circuit and better signal-to-noise ratios (SNR), though additional integrators may cause stability issues in the channel driver circuit.

Figure 4A:
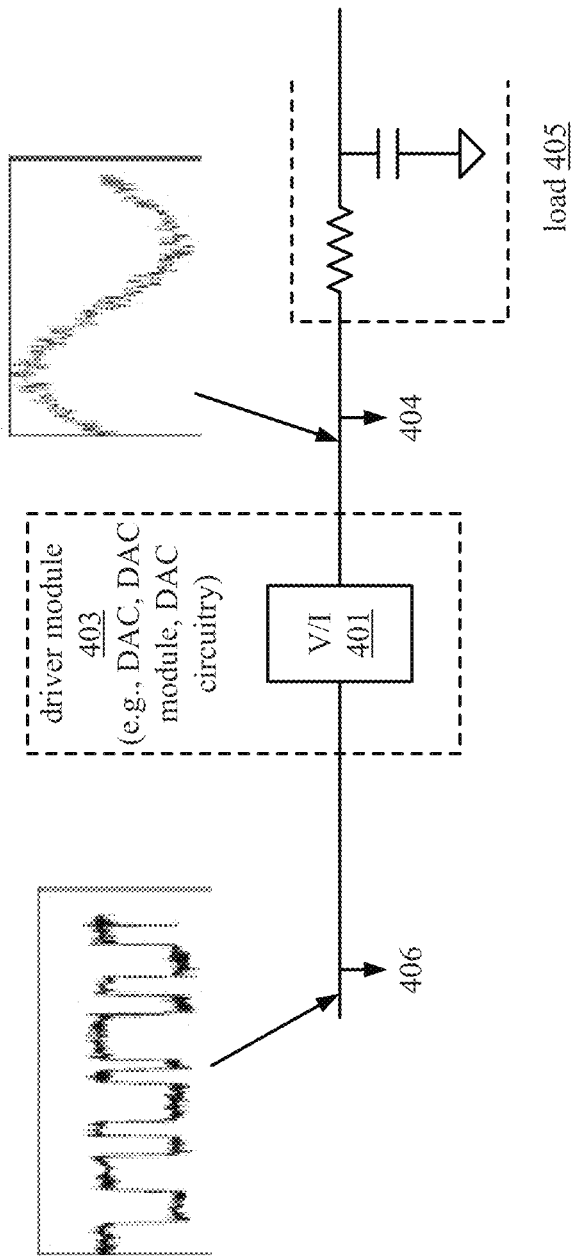
FIG. 4A is a schematic block diagram of an embodiment of a driver module (e.g., which may be implemented as a digital to analog converter (DAC)) in accordance with the present invention.

FIG. 4A is a schematic block diagram of an embodiment of a driver module (e.g., which may be implemented as a digital to analog converter (DAC)) in accordance with the present invention. In some examples, a driver module 403 is implementation to include a current driver or a voltage driver. In some examples, the driver module 403 includes a voltage-to-current (V/I) converter 401. The V/I converter 401 is controlled based on a current setting value.

In an example of operation and implementation, the current setting value is set during a start-up of the channel driver circuit. The V/I converter 401 receives a digital pulsed signal with shaped noise and converts the signal into a pulsed current analog signal with filtering occurring on the load 405 with residual shaped noise remaining at 404 depending on the output impedance of the V/I and the amount of external capacitance, as shown in FIG. 4A. The digital pulsed signal with shaped noise may be received from the digital output node 406, and the analog signal with noise provided to the channel I/O node 404.

Figures 4B, 4C:
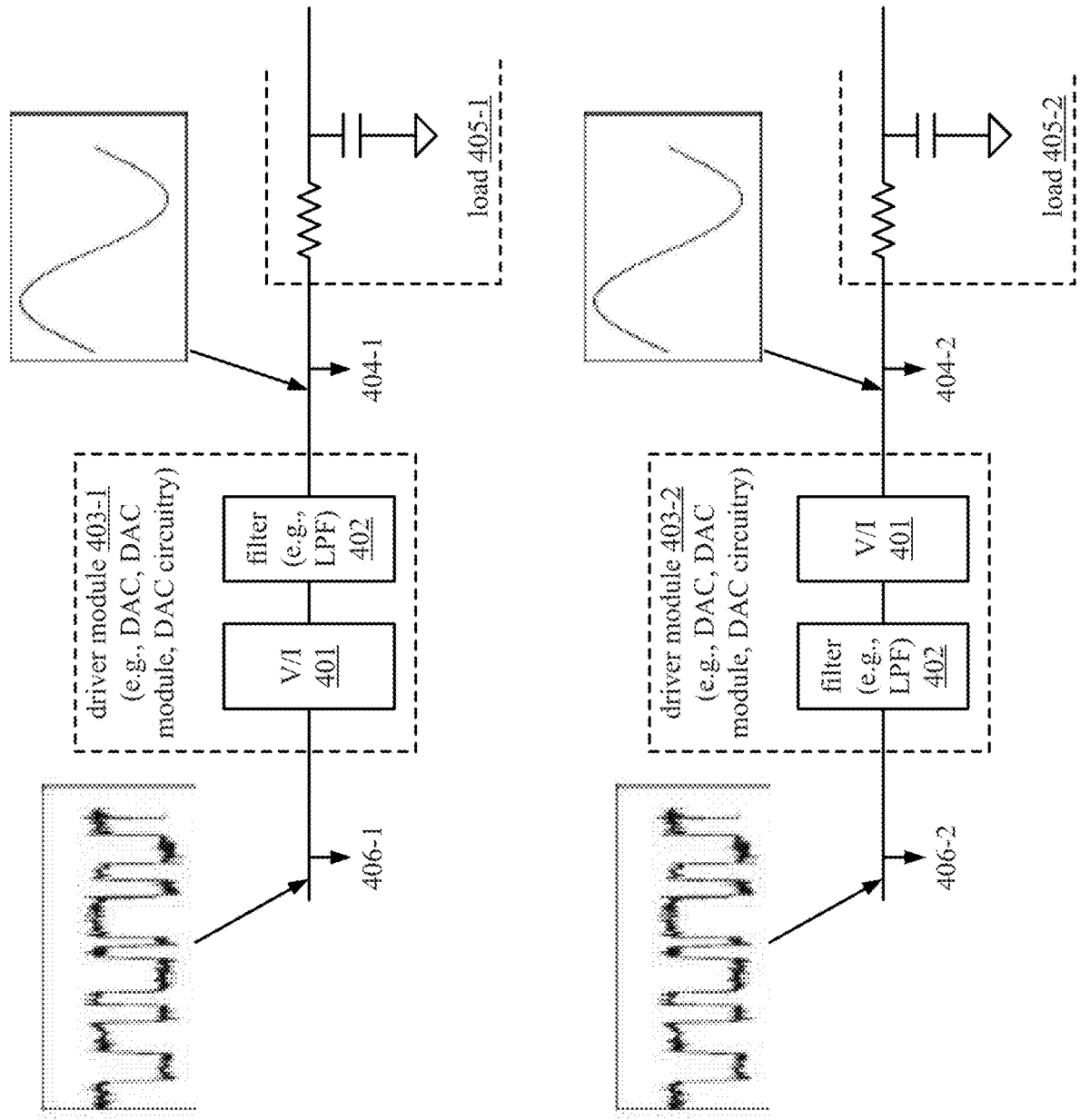
FIG. 4B is a schematic block diagram of an embodiment of a driver module (e.g., which may be implemented as a DAC) in accordance with the present invention.
FIG. 4C is a schematic block diagram of another embodiment of a driver module (e.g., which may be implemented as a DAC) in accordance with the present invention.

FIG. 4B is a schematic block diagram of an embodiment of a driver module (e.g., which may be implemented as a DAC) in accordance with the present invention. In this diagram, a driver module 403-1 is implemented to include a filter 402 at the output and coupled to the channel I/O node 404-1. The V/I converter receives a digital pulsed signal then the filter 402 smooths and provides a filtered analog signal to the channel I/O node 404-1 and to load 405-1. The digital pulsed signal with shaped noise may be received from the digital output node 406-1, and the analog signal with noise provided to the channel I/O node 404-1 and to load 405-1.

FIG. 4C is a schematic block diagram of another embodiment of a driver module (e.g., which may be implemented as a DAC) in accordance with the present invention. In this diagram, a driver module 403-2 is implemented to include filter 402 at the input and coupled to the digital output node 406-2 and precede the V/I converter 401, as shown in FIG. 4C. The filter 402 receives a digital pulsed signal with shaped noise and removes the unwanted higher frequency components (e.g., such as when the filter 402 is implemented as a LPF). The filtered signal is then passed to the V/I converter 401, which provides a varying current analog signal to the channel I/O node 404-2 and to the load 405-2.

Functionally, the driver module 403, 403-2, or 403-2 is configured to receive the digital signal from a SD module and pushes out the channel driving signal to the channel I/O node 404, 404-1, or 404-2. The channel driving signal may be a sine wave with shaped noise, with the shaped noise filtered by filter 402 (e.g., which may be implemented as a LPF). Further, the V/I converter 401 can be configured to generate a channel driving signal with a high impedance level. For example, the channel driving signal may have an impedance of 50 kilo-ohms (kΩ). In some examples, the filter 402 is implemented as a LPF configured to filter out noise signals when the SD module is a $2^{nd}$ or $3^{rd}$ order sigma-delta module. The outer loop delta modulation may be augmented in this scheme with a multiple orders of sigma-delta front end, via the SD module, to gain the benefits of the latest advancements in sigma-delta technology in noise shaping and resolution at the expense of increasing the complex analog circuit usage.

Note that the alternative various implementations of channel driver circuits with various implementations of a differential module, a SD module, and a driver module may be made.

Figure 5:
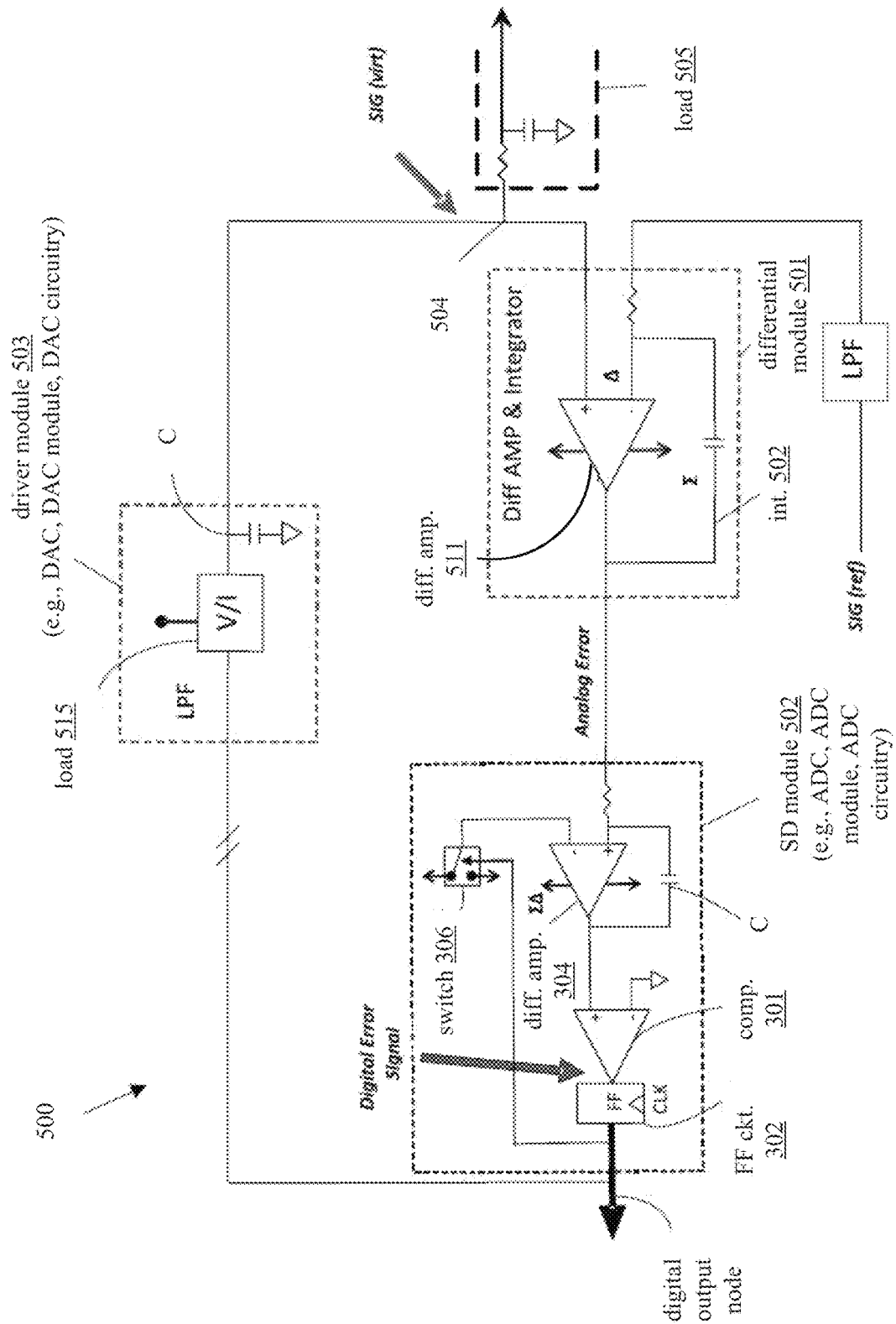
FIG. 5 is a schematic block diagram of an embodiment of a $2^{nd}$ order channel driver circuit in accordance with the present invention.

FIG. 5 is a schematic block diagram of an embodiment of a $2^{nd}$ order channel driver circuit in accordance with the present invention. In this diagram, a $2^{nd}$ order channel driver circuit 500 is shown. The channel driver circuit 500 includes the differential module 101, the SD module, and the driver module 103. The differential module 501 includes a differential amplifier 501 coupled to the SD module, where the differential amplifier 511 is configured to receive a reference signal SIG (ref) at one input. The differential module 501 also includes an integrator 502 coupled to the output of the differential amplifier 501 and an input of the differential amplifier 501 that receives the reference signal SIG (ref). The driver module 503 that forms an outer loop feedback channel from the output of the SD module at a digital output node to the differential module 501. The SD module may include a $1^{st}$ order SD module (e.g., such as described with reference to FIG. 3C). Alternative implementations of SD modules may be implemented. In some examples, the driver module 503 is configured to provide a variable power output to a channel I/O node 504 to drive the channel driving signal at a desired current or voltage to the load 105. In this example, the driver module 103 has a low pass converter based on a V/I converter 505 followed by a capacitor 506.

The channel driver circuit 500 of FIG. 5 illustrates a $2^{nd}$ order sigma-delta design. The circuit has higher order noise shaping capabilities with fewer components in comparison to other designs. In an exemplary embodiment, channel driver circuit 500 is implemented on a field programmable gate array (FPGA) and operates with continuous-time sigma-delta modulation.

In some examples, a channel driver circuit may be configured for concurrent modality of providing signals at one or more frequencies to an analog I/O via channel I/O node and monitoring the response of the driven signals and simultaneously receiving one or more externally generated signal frequencies. The channel driver circuit uses continuous coherent sampling while driving and simultaneously receiving multiple waveforms to the analog device allowing for advanced signal processing methods of the channel out digital data. Further, in certain applications such as a touch-screen operation, the channel driver circuit is configured for parallel communicating transmit/receive signals for mutual capacitance operation with one or more rows transmitting (using a different frequency per line) continuously and all columns receiving continuously (or vice versa).

A channel driver circuit (e.g., such as channel driver circuits 100, 500) can be implemented using FPGA or an ASIC. In accordance with various embodiments, a channel driver circuit is capable of targeted sigma-delta noise shaping notching. The noise factor is shaped to a small range, such as 25 kHz to 125 kHz to improve the noise floor compared to a typical range of 0 to 200 kHz.

In various embodiments, a channel driver circuit includes feedback impedance network and I/O impedance networks resistive components with variable or switched capacitor current shuttles with controllable frequency and duty cycle. The variable impedance allows changes to gain (inverting and non-inverting gain of the digital op-amp) and drive impedance. Further, a switched power supply (with frequency and duty cycle control) or switched capacitor charge pump is coupled to the driver module 103 on the feedback loop such that high voltage can be used to increase voltage overhead necessary due to gain on the digital op-amp or to increase the output signal driven onto the analog device. In some embodiments, the rails of the differential amplifiers, comparator, and switches will also have high voltage rails. When the channel driver circuit is an $M^{th}$ order circuit, the driver module reconstruction filter and SIG (ref) reconstruction filter can be M−1 order filters or higher. In various embodiments, the differential module can be replaced with a differential amplifier having good power supply ripple rejection (PSRR) and electrostatic discharge (ESD) protection, with high input impedance and low bias current.

Figure 6:
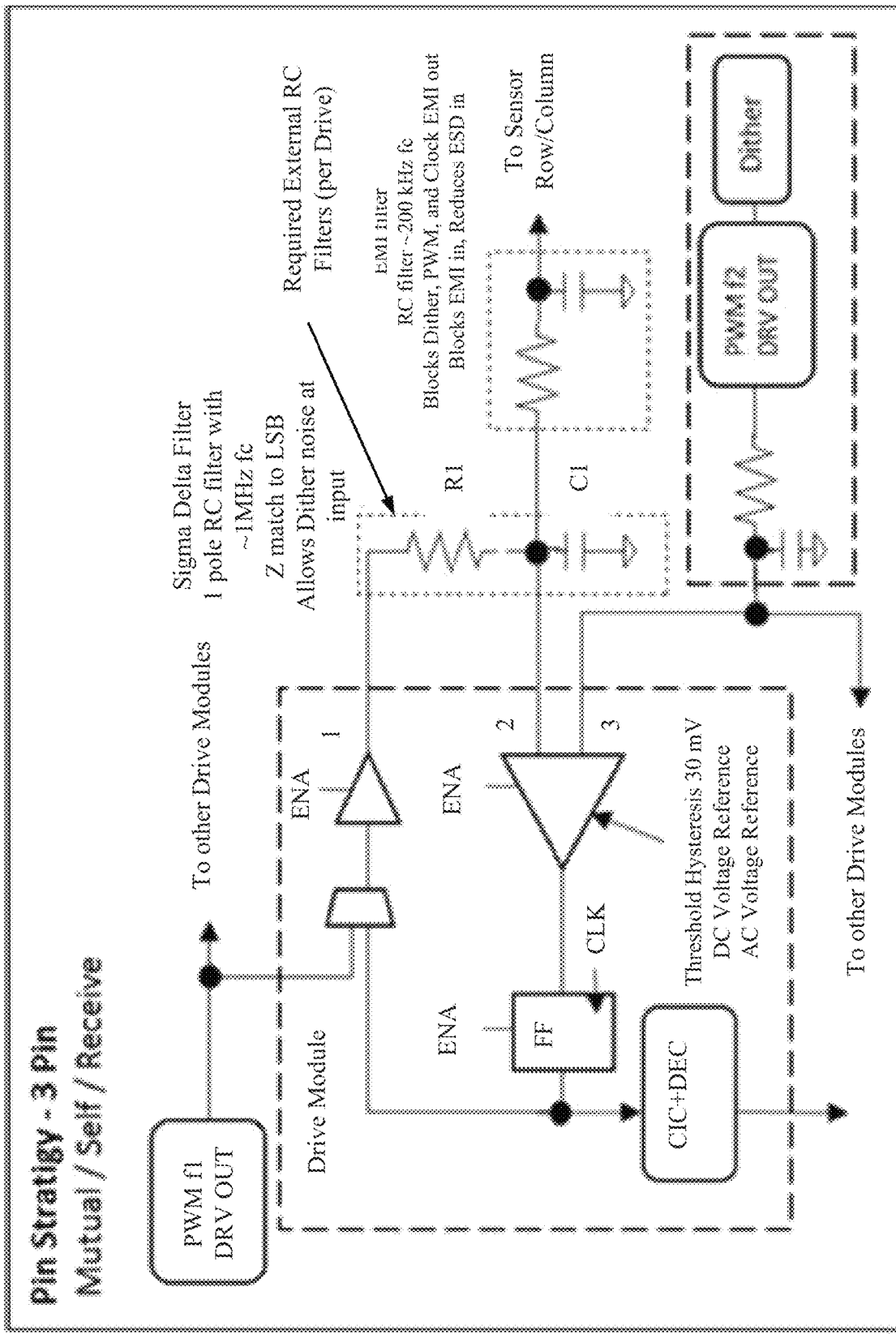
FIG. 6 is a schematic block diagram of an embodiment of a pulse modulator circuit in accordance with the present invention.

FIG. 6 is a schematic block diagram of an embodiment of a pulse modulator circuit in accordance with the present invention. This diagram shows a pulse modulator formed by output digital-to-analog converter (DAC) (1) and integrator resistor (R1) and capacitor (C1), feeds the analog-to-digital converter (ADC) (2) input node on the 1 bit comparator directly at unity gain and then feed the output filter (EMI Filter) and sensor element (To Sensor Row/Column). This allows the modulator to follow the second comparator input (3) while at the same time generating the internal digital representation of the signal (flip-flop output) required for following including any phase or amplitude shifts due to circuit non-linearity or changes to the impedance of the sensor element.

The pulse modulator, formed by output DAC and integrator capacitor, may feed the ADC (input node on the 1 bit comparator) indirectly through a feedback impedance network and then feed the output filter and sensor element. This allows the modulator to follow the second comparator input while at the same time generating the internal digital representation of the signal required for following including any phase or amplitude shifts. This feedback impedance network in combination with the filter and sensor impedance networks may be used and configured to set the analog integrator and associated internal digital signal gain to a greater than unity. Further, the networks may be set to control the gains at different frequencies.

In addition, this disclosure also presents an Analog Front End (AFE) channel driver that acts as a channel driver to output signals and produce an analog error output with gain set by feedback impedance control. In addition, the impedance control also operates as impedance control to the channel output signal properties. For various applications and as desired by design, sigma-delta (SD) analog to digital converters (ADC) may be a preferred digitization method when coupled to the disclosed AFE for the digitization and output of continuous measurements due to various benefits provided thereby including the SD's enhanced resolution and noise shaping properties. In addition, the analog error signal may also be further processed by a classical ADC (FLASH, SAR, Integrating, etc.) to digitize the output signal properties.

Figure 7:
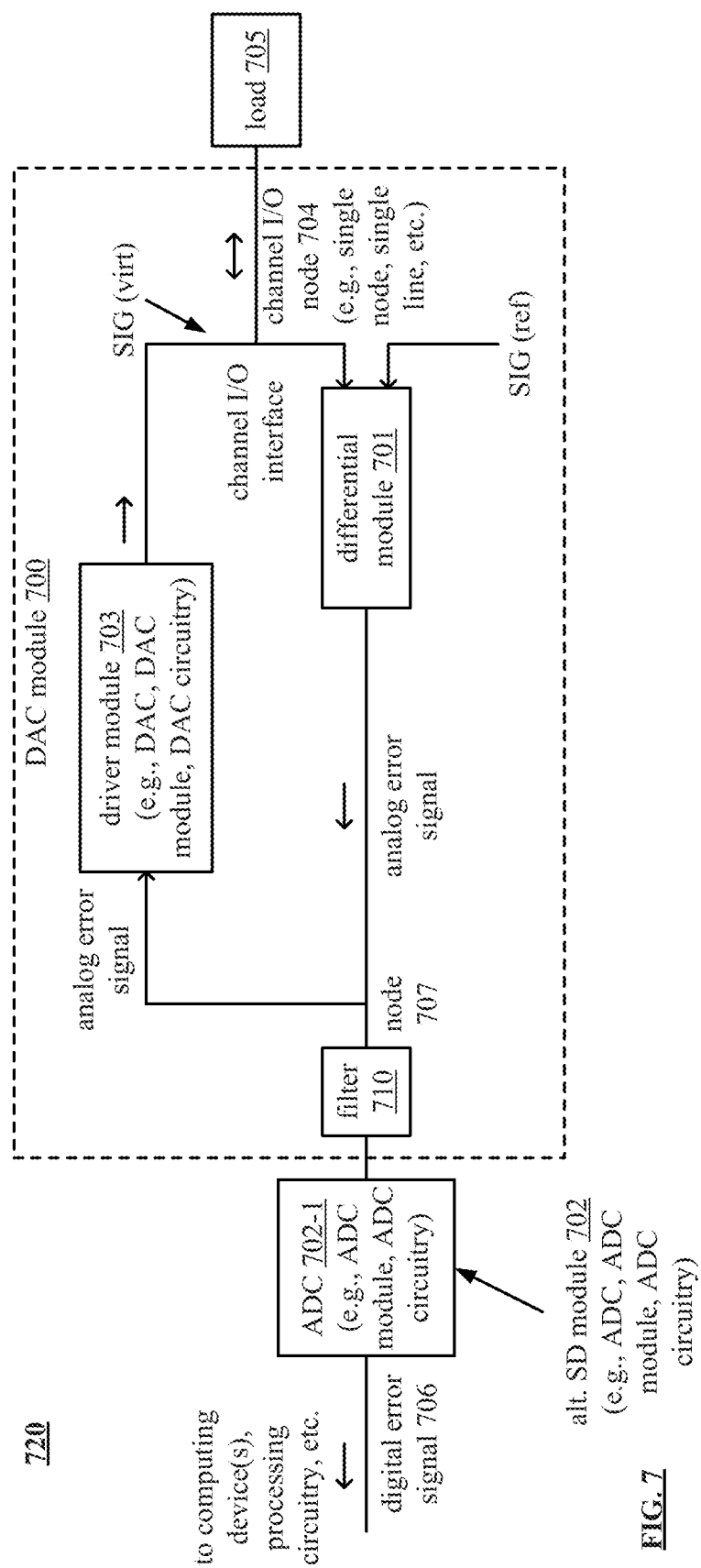
FIG. 7 is a schematic block diagram of an embodiment of an Analog Front End (AFE) channel driver circuit in accordance with the present invention.

FIG. 7 is a schematic block diagram of an embodiment of an Analog Front End (AFE) channel driver circuit in accordance with the present invention. This diagram shows an AFE channel driver conversion system 720, with an analog to digital conversion (ADC) module 702-1 (which may alternatively be implemented as an SD module 702) coupled to the output of an AFE channel driver circuit in accordance with various embodiments. The AFE channel driver circuit includes DAC module 700 that includes a differential module 701 coupled to an ADC module 702, where the differential module 701 includes a differential amplifier and is configured to receive a signal reference (SIG (ref)) at one input. The AFE channel driver circuit further includes a driver module 703 that forms an outer loop feedback from the output of the differential module 701 at an analog output node 707.

The driver module 703 may be configured as a voltage to current circuit and further configured to provide a variable power output capability via an impedance setting control to a channel input/output (IO) node 704 to drive an analog signal at a desired current to a load 705. The driver module 703 receives an analog error signal from the differential module 701 and converts the voltage error signal into an output current which, when reconstructed on load 705, forms an analog format substantially similar to SIG (ref). This reconstructed signal is a virtualized version of the SIG (ref) signal and referred to hereafter as SIG (virt). Thus, the AFE channel driver circuit has an analog I/O at the channel I/O node 704 and an analog error output at node 707. In various embodiments, the analog error signal at node 707 may pass through a filter 710 performing the function of anti-aliasing or pass band limiting before coupling to the ADC module 702. In operation, the ADC module 702 performs an analog-to-digital conversion of the analog error signal created by the AFE channel driver circuit from the difference between the SIG (ref) and the SIG (virt) signals.

The channel I/O node 704 is a node coupled to the driver module 703, an input of the differential module 701, and the load 705. The load 705 can be an analog device, such as any device or circuit capable of receiving and/or transmitting an analog signal to the AFE channel driver circuit, or an impedance network where changes to the network impedance are to be measured. For example, the analog device may be a touchscreen, which is an impedance network typically formed of resistances and capacitances, where an analog signal of typically less than 7 Mhz is driven to the touch screen and a returning analog signal or change to the driven signal can indicate whether a touch event has occurred. An externally injected signal may also be received in normal operation, such as a 500 kHz signal present on the tip of a floating electrostatic pen. The AFE channel driver circuit can also be used in applications with zero resistance sensors (wires), inductors, capacitors, or resistive elements, high frequency (HF) sensing using channel driver frequency greater than 7 megahertz (MHz) for the transmission and reception of HF signal, or as a form of network analyzer where pulses or signals of different frequencies can be used to quantify an unknown external impedance network coupled as a load 705.

The signal present at the channel I/O node 704 may be referred to as a channel driving signal. This signal is driven by the system 720 and acts as a virtual version of SIG (ref). In various embodiments, the channel driving signal includes the analog output signal SIG (virt) generated by the driver module 703 onto the load 705. Any signal sourced from the load 705 will be zeroed as a signal into a virtual ground but will become present as an inverted part of the spectrum of the analog signal error at node 707.

In various embodiments, the differential amplifier circuit in the differential module 701 has a first input port coupled to the channel I/O node 704 and a second input node receiving the reference signal SIG (ref). SIG (ref) is a reference signal desired to be output to the load 705 after being processed by the AFE channel driver circuit. The differential module 701 compares and amplifies the difference between SIG (ref) and the SIG (virt) generating an analog error signal at node 707, which is sent to the input of the driver module 703. The analog error signal from the differential module 701 is also coupled to the input of the ADC module 702.

The differential module 701 of the previous diagram may be implemented in a variety of embodiments based on the desired performance/attributes/characteristics required by the AFE channel driver circuit.

In an example of operation and implementation, a channel driver circuit includes a differential module (e.g., such as differential module 701 of DAC module 700) and a driver module (e.g., such as driver module 703 of DAC module 700).

The differential module is configured to receive a reference signal. The differential module is also configured to receive, via a single node of a load, a channel driving signal that is provided to the load at the single node. The differential module is also configured to generate an analog error signal that is based on the channel driving signal and the reference signal. Note that the channel driving signal is based on an electrical characteristic of the load.

The driver module is coupled to the differential module and configured to generate the channel driving signal based on the analog error signal or a digital error signal corresponding to the analog error signal. The driver module is also configured to transmit the channel driving signal via the single node to the load. Note that the channel driver circuit is configured simultaneously to transmit the channel driving signal to the load at the single node and to sense the channel driving signal at the single node.

In some variant embodiments, the channel driver circuit also includes a sigma-delta module that is coupled to the differential module and configured to receive the analog error signal. Note that such a sigma-delta module is implemented as an ADC in some examples. The sigma-delta module is configured to process the analog error signal to generate the digital error signal corresponding to the analog error signal. Also, the sigma-delta module is configured to transmit the digital error signal corresponding to the analog error signal to a computing device and/or processing circuitry to be processed in accordance with interpreting the digital error signal.

In some examples, the differential module includes a differential amplifier having a first input port configured to receive the channel driving signal, a second input port configured to receive the reference signal, and an output port configured to output the analog error signal. Also, the sigma-delta module includes an analog to digital converter (ADC) configured to process the analog error signal to generate the digital error signal corresponding to the analog error signal. In addition, the driver module includes a digital to analog converter (DAC) configured to generate the channel driving signal based on the digital error signal corresponding to the analog error signal.

In addition, in some other examples, the sigma-delta module includes a comparator configured to receive the analog error signal and to process the analog error signal to generate the digital error signal corresponding to the analog error signal. Also, the sigma-delta module includes a flip-flop circuit configured to store the digital error signal at least temporarily before transmitting the digital error signal corresponding to the analog error signal to the computing device and/or the processing circuitry to be processed in accordance with interpreting the digital error signal.

In some examples, the channel driver circuit also includes a filter configured to process the analog error signal in accordance with anti-aliasing filtering and/or pass band limiting to generate a filter signal. In addition, the channel driver circuit includes an analog to digital converter (ADC) configured to process the analog error signal to generate the digital error signal corresponding to the analog error signal. The ADC is also configured to transmit the digital error signal corresponding to the analog error signal to a computing device and/or processing circuitry to be processed in accordance with interpreting the digital error signal corresponding to the analog error signal.

In addition, in some examples, the differential module includes a differential amplifier having a first input port configured to receive the channel driving signal, a second input port configured to receive the reference signal via a resistor, and an output port that is coupled to the second input port via another resistor and/or a capacitor and is configured to output the analog error signal. Note that the analog error signal is output from the differential amplifier as a single-ended analog error signal or a differential analog error signal.

Also, in some examples, the driver module includes a voltage to current converter circuitry configured to generate the channel driving signal based on the analog error signal or the digital error signal corresponding to the analog error signal.

Note that the load may be of any of a variety of types including any one or more of an electrode of a touchscreen, a sensor, a transducer, a device, an integrated circuit, circuitry, a computer, a tablet, a smart phone, an appliance, or a motor.

Figure 8A:
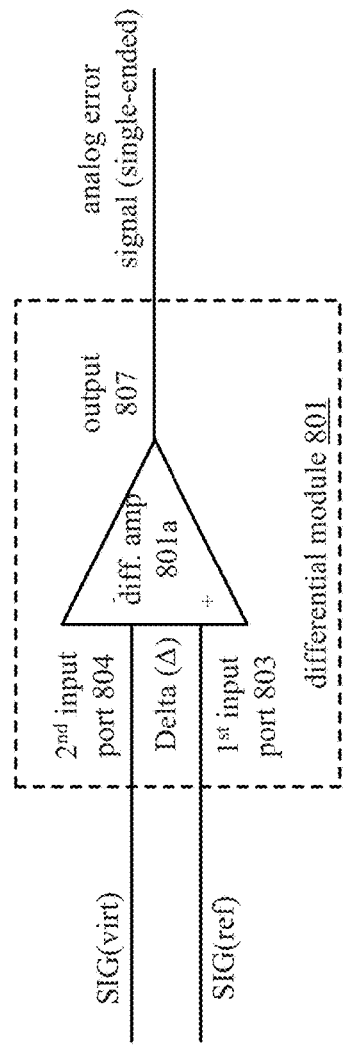
FIG. 8A is a schematic block diagram of another embodiment of a differential module in accordance with the present invention.
Figure 8B:
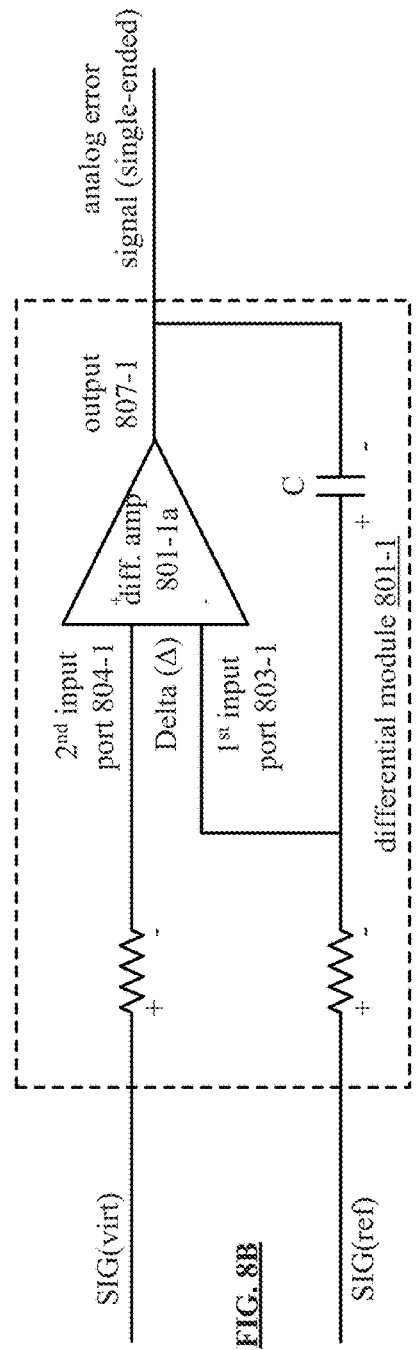
FIG. 8B is a schematic block diagram of another embodiment of a differential module in accordance with the present invention.
Figure 8C:
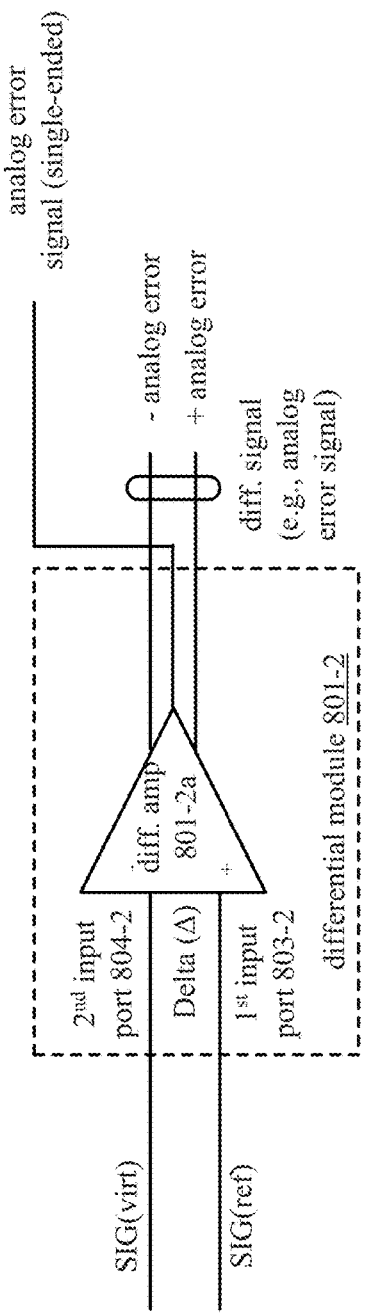
FIG. 8C is a schematic block diagram of another embodiment of a differential module in accordance with the present invention.

FIGS. 8A-8C illustrate examples of possible embodiments of a differential module. Each of the embodiments shown in FIGS. 2A-2C illustrate various implementations of a differential module including a respective differential amplifier configured to receive a first input signal SIG (ref) at a first input port and a second input signal SIG (virt) at a second input port, and generate an analog error signal at output.

FIG. 8A is a schematic block diagram of another embodiment of a differential module in accordance with the present invention. This diagram illustrates the differential module 801 generating a single ended analog error signal at the output 207. Differential amplifier 801a is configured to receive a first input signal SIG (ref) at a first input port 803 and a second input signal SIG (virt) at a second input port 804, and generate an analog error signal at output 807 (e.g., a single-ended analog error signal).

FIG. 8B is a schematic block diagram of another embodiment of a differential module in accordance with the present invention. This diagram illustrates the differential amplifier 801 further including a capacitor 805 acting as an integrator and coupled between the output 807 and the second input port 803. Differential amplifier 801-1a is configured to receive a first input signal SIG (ref) at a first input port 803-1 and a second input signal SIG (virt) at a second input port 804-1, and generate an analog error signal at output 807-1 (e.g., a single-ended analog error signal).

FIG. 8C is a schematic block diagram of another embodiment of a differential module in accordance with the present invention. Differential amplifier 801-2a is configured to receive a first input signal SIG (ref) at a first input port 803-2 and a second input signal SIG (virt) at a second input port

804-2, and generate an analog error signal at output 807-2 (e.g., a single-ended analog error signal or a differential analog error signal).

In the embodiments illustrated in FIGS. 8A and 8C, the negative terminal of the differential amplifier 801 can be configured to receive SIG (ref) and the positive terminal of the differential amplifier 810 can be configured to receive the channel driving signal SIG (virt). Conversely, as shown in FIG. 8B the negative terminal of the differential amplifier 801 can be configured to receive the channel driving signal SIG (ref) and the positive terminal of the differential amplifier 801 can be configured to receive SIG (ref), where correcting inversion can be accomplished in a driver module by inverting the output current. The differential module may include one or more inverters to invert various signals as needed or desired in a particular implementation. In some examples, a differential amplifier may also be implemented include a combination of circuit functions as described herein.

FIG. 9A is a schematic block diagram of another embodiment of a driver module (e.g., which may be implemented as a DAC) in accordance with the present invention. This diagram includes a driver module 903 that include a current driver such as a voltage-to-current (V/I) converter 901. The V/I converter 901 converts a voltage to a current in accordance with a settable output impedance 906. In some examples, this is performed during a start-up of a AFE channel driver system. The V/I converter 901 receives an analog error voltage signal at node 907 from the difference module output, and generates the SIG (virt) signal through negative feedback and gain of the system at the channel I/O node 904, which connects to the load 905.

FIG. 9B is a schematic block diagram of another embodiment of a driver module (e.g., which may be implemented as a DAC) in accordance with the present invention. In some examples, a driver module 903-1 is implemented to include a low pass filter (LPF) 920-1 at the output and coupled to the channel I/O node 904-1, as shown in FIG. 9B. The V/I converter 901-1 receives an analog error signal and outputs a current with controllable impedance setting 906-1. Then, the LPF 920-1 converts the current back into a voltage signal which is delivered to the channel I/O node 904-1.

Functionally, the driver module 903 or 903-1 is configured to receive the analog error signal from a differential module and pushes out a current that is reconstructed on the output (e.g., optionally from LPF 920-1) or delivered directly to the channel I/O node 904 or 904-1 and reconstructed on the load 905 or 905-1. The feedback loop formed by the driver module 903 or 903-1 903 forces the reconstructed voltage SIG (virt) to be substantially similar to the reference signal SIG (ref). Further, the V/I converter 901 or 901-1 is configured to generate a channel driving signal with a low virtual output impedance while still measuring changes to the external signals with high gain and an equivalent high input impedance. For example, the channel driving signal SIG (virt) may have a virtual output impedance of 50 ohms (Ω) but the effective input impedance of the signals as seen by an ADC module may be 50,000Ω.

Figure 10:
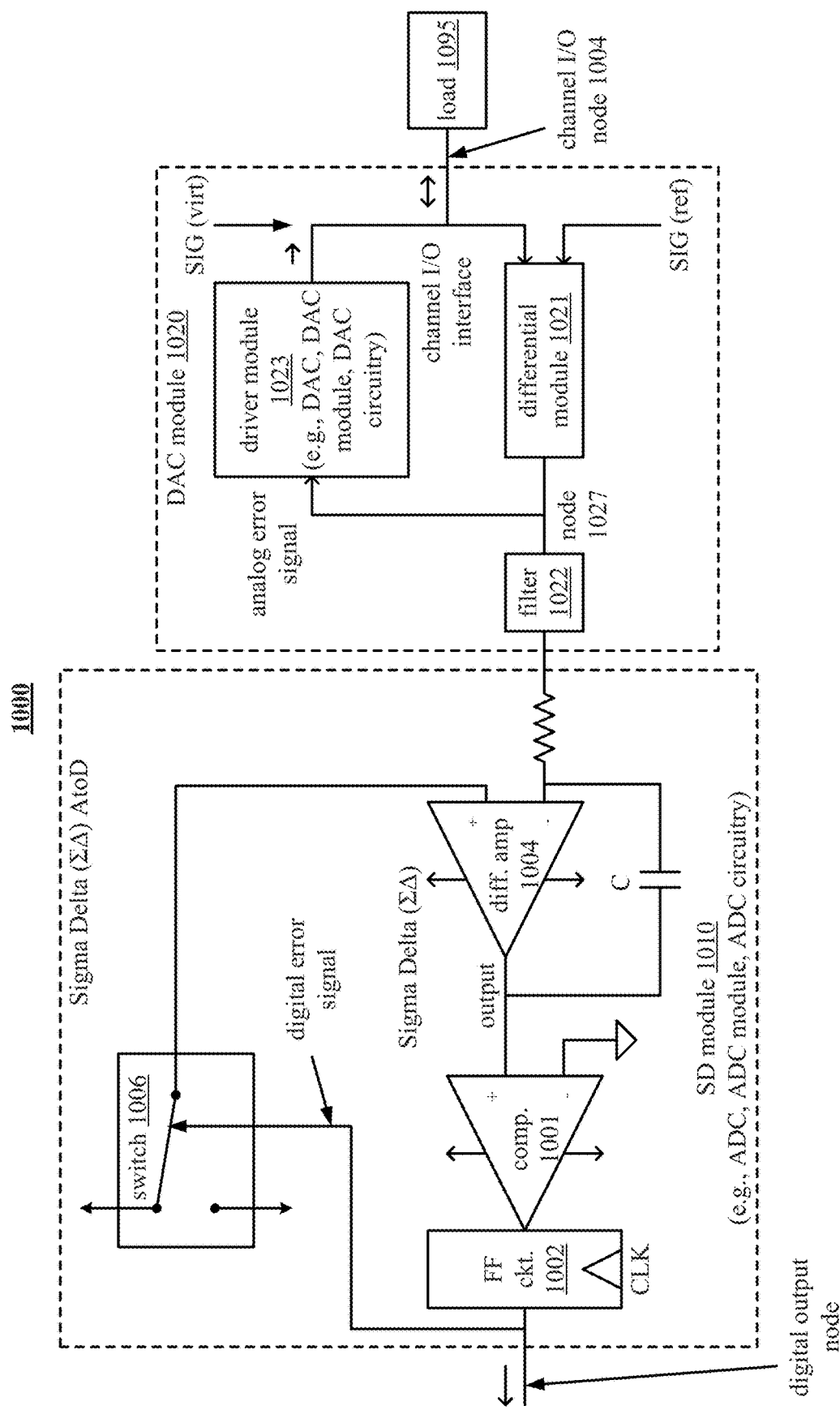
FIG. 10 is a schematic block diagram of an embodiment of an AFE channel driver circuit coupled to a $1^{st}$ order sigma-delta (SD) module in accordance with the present invention.

FIG. 10 is a schematic block diagram of an embodiment 1000 of an AFE channel driver circuit coupled to a $1^{st}$ order sigma-delta (SD) module in accordance with the present invention. Note that an ADC module such as described herein may be implemented in a variety of ways including using analog to digital or sigma-delta modulation techniques for conversion of the analog error signal to a digital form. This diagram illustrates an AFE channel driver circuit coupled to a SD module 1010 (e.g., which may be implemented as an ADC, ADC module, ADC circuitry, etc.) included of a $1^{nd}$ order sigma-delta modulator circuit.

This diagram includes DAC module 1000 that includes a differential module 1021 coupled to SD module 1010 via a filter 1022, where the differential module 1001 includes a differential amplifier and is configured to receive a signal reference (SIG (ref)) at one input. The DAC module 1020 includes a driver module 1023 that forms an outer loop feedback from the output of the differential module 1021 at an analog output node 1027.

The driver module 1023 may be configured as a voltage to current circuit and further configured to provide a variable power output capability via an impedance setting control to a channel input/output (10) node 1004 to drive an analog signal at a desired current to a load 1095. The driver module 1003 receives an analog error signal from the differential module 1001 and converts the voltage error signal into an output current which, when reconstructed on load 1095, forms an analog format substantially similar to SIG (ref). This reconstructed signal is a virtualized version of the SIG (ref) signal and referred to hereafter as SIG (virt). Thus, an analog I/O is provided at the channel I/O node 1004 and an analog error output at node 1027. In various embodiments, the analog error signal at node 1027 may pass through the filter 1022 performing the function of anti-aliasing or pass band limiting before coupling to the SD module 1010. In operation, the SD module 1010 performs an analog-to-digital conversion of the analog error signal created by the DAC module 1020 from the difference between the SIG (ref) and the SIG (virt) signals.

The channel I/O node 1004 is a node coupled to the driver module 1023, an input of the differential module 1021, and the load 1095. The load 1095 can be an analog device, such as any device or circuit capable of receiving and/or transmitting an analog signal to the AFE channel driver circuit, or an impedance network where changes to the network impedance are to be measured.

The SD module 1010 includes an differential amplifier 1004, a capacitor C, a comparator 1001, a flip-flop circuit 1002, and a switch 1006. The capacitor C is an integrator coupled between an input and the output of the differential amplifier 1004. Further, the differential amplifier 1004 provides a modulated analog error signal to the comparator 1001. The comparator 1001 and flip-flop circuit 1002 forms a 1-bit ADC with latch as discussed above, with the flip-flop circuit 1002 storing the 1-bit output from the comparator 1001. The 1-bit output forms a digital signal as an output signal, which also controls the switch 1006. The comparator 1001 compares the modulated error signal of the differential amplifier 1004 and a reference signal to generate a digital error signal. If the analog error signal has increased in comparison to a reference signal (e.g., shown as signal ground in FIG. 10), the comparator 1001 generates a one ("1"). If the analog error signal has decreased, the comparator 1001 generates a zero ("0"). As such, the SD ADC transmits the changes in, or the gradient of, the analog error signal. The flip-flop circuit 1002 stores the 1-bit output from the comparator 1001. The 1-bit output forms a digital shaped noise spectrum waveform as an output signal, which also controls the switch 1006. The switch (a feedback DAC) controls whether the high or low reference voltage is connected to the second input of the differential amplifier 1004. The switch 1006 is connected to the high reference voltage when the flip-flop circuit 1002 has a one ("1") value and is connected to the low reference voltage when the flip-flop circuit 1002 has a zero ("0") value, or vice versa. The high or low level is subtracted from the incoming signal to the differential amplifier 1004 from the differential module 101 and the difference is integrated on capacitor C thus the sigma-delta module tracks the average error and converts the incoming signal into a digital pulse stream. Moreover, in various embodiments, the SD module 1010 can be of different architectures such as sigma-delta, successive approximation, integrating, flash, etc.

Figure 11:
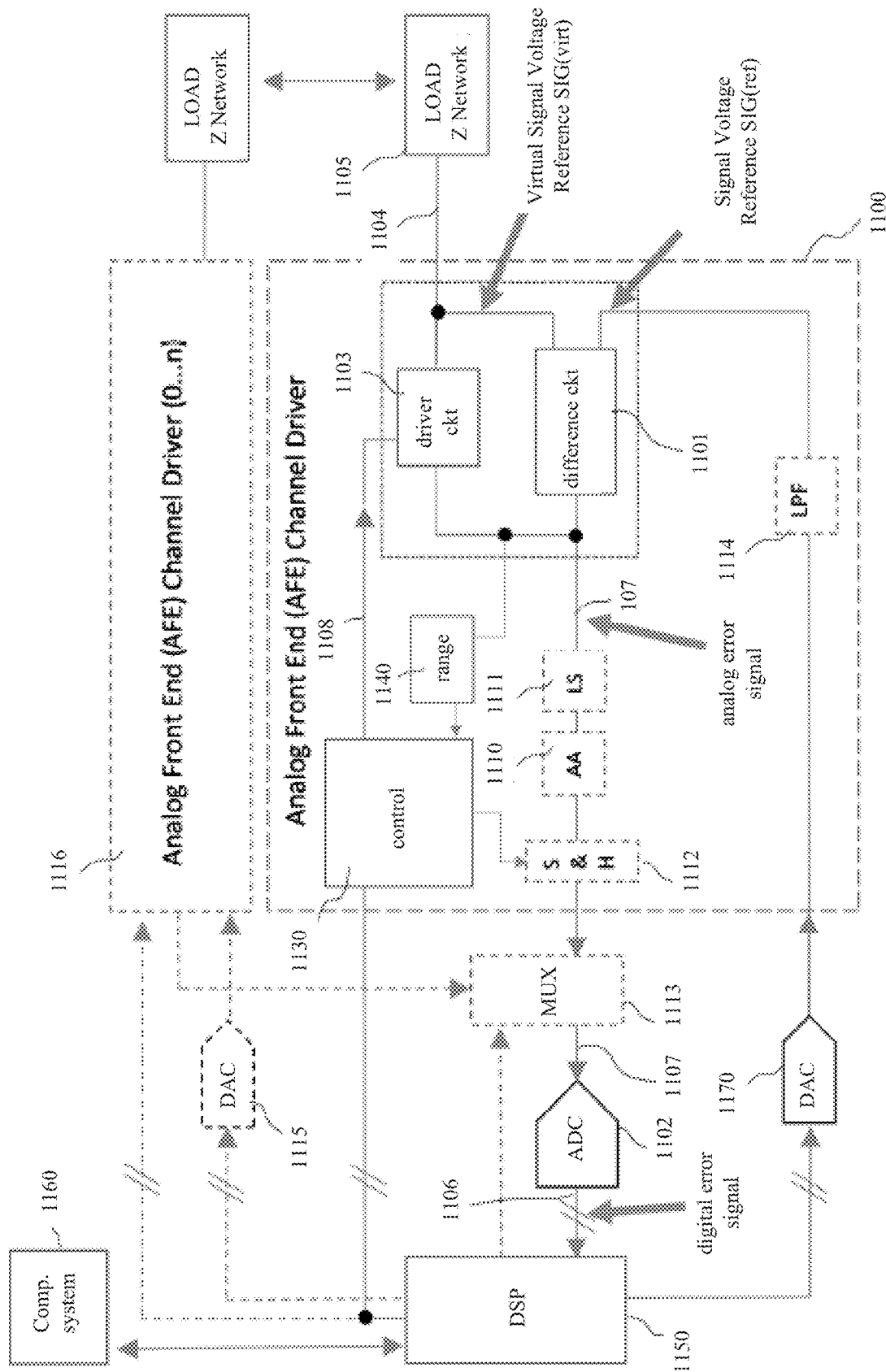
FIG. 11 is a schematic block diagram of an embodiment of an AFE channel driver circuit with DSP, computing system (e.g., one or more computing devices and/or processing circuitry), and multi-channel load interaction in accordance with the present invention.

FIG. 11 is a schematic block diagram of an embodiment of an AFE channel driver circuit with DSP, computing system (e.g., one or more computing devices and/or processing circuitry), and multi-channel load interaction in accordance with the present invention. The AFE channel driver system may have multiple AFE channel driver circuits (0, . . . , n) as shown in FIG. 11 with AFE channel driver circuits 1100 through 1116 (e.g., with AFE channel driver circuit 1116 depicting (0 to n) channels). Each AFE channel driver circuit 1100 through 1116, when used as a system interface, may be implemented to connect to a LOAD Z Network 1105 element, such as a touchscreen system.

In FIG. 11, an AFE channel driver circuit, for example AFE channel driver circuit 1100, includes a differential module 1101 coupled to a driver module 1103. The differential module 1101 is configured to receive a reference signal SIG (ref) at a first input and a signal SIG (virt) at a second input. The driver module 1103 forms a feedback channel from the output at node 1107 of the differential module 1101 to the second input of the differential module 1101. The driver module 1103 and the second input of the differential module 1101 are also coupled to a load 1105 impedance network, such as a touch screen. The AFE channel driver circuit 1100 may further include typical functions in support of analog and digital circuits such as band pass references, power voltage regulators, etc.

In addition, in various embodiments, the AFE channel driver circuit 1100 may include a level shifting (LS) circuit 1111, an anti-aliasing (AA) filter 1110, a sample and hold (S&H) circuit 1112, or a combination thereof. The AA filter 1110 may be located between the output of the differential module 1101 and a coupled ADC 1102 to prevent aliasing if desired. The LS circuit 1111 may be located between the output of the differential module 1101 and a coupled ADC 1102. The LS circuit 1111 can be used in embodiments where the external system ground driven by an AFE Channel Analog System differs from the external ground driven by an AFE Channel Digital System in order to transition the analog signal between the two systems. For example, the analog system may require the AFE to drive a +/−1V signal with a ground reference of −2V.

Typically, an S&H circuit is built into the ADC 1102. However, it can be beneficial to locate the S&H circuit 1112 between the output of the differential module 1101 and a coupled ADC 1102 in a "scanned system" or system using less than one ADC per channel to quickly convert all the channels in a system. Such a system is illustrated by the multiple AFE channel driver circuits 1100, 1116 and a Mux 1113 in FIG. 11. To maintain the concurrent modality properties of the multiple AFE channel driver circuits 1100, 1116, analog channel signals can be sampled simultaneously, where the sample value is held while the multiple channels are read by an ADC 1102. Common mode noise may be subtracted in the digital realm since all the samples are taken at one instant.

In various embodiments, the AFE channel driver circuit 1100 may further include a range detection circuit 1140 and a control block 1130. The range detection circuit 1140 is coupled to the differential module 1101 at output node 1107, and provides a signal if the amplitude of the analog error signal is greater than the input range of the ADC to the control block 1130. The control block 1130 sets the impedance of the driver module 1103 in a digitally controlled or automated manner, so as to prevent signal saturation (clipping) at the ADC module 1102. The control block 1130 can be configured for testing, power control, clocking, gain/impedance setting, out of range detection, or other control or reporting function coupled to a processing or state machine shown here as DSP block 1150.

The output of the AFE channel driver circuit 1100 may be coupled to a multiplexer circuit (Mux) 1113, which is coupled to an ADC module 1102. In some examples, the ADC module 1102 is implementation as a sigma-delta type similar to the analog to digital converter such as with reference to FIG. 10, or alternatively, as any other type of ADC such as FLASH, SAR, or any means of converting or digitizing the analog signal into a digital format.

Certain prior art touch systems typically employ S&H and MUX circuits on an input side of the system, where the Mux system causes added noise and loss of signal due to the internal switch transistors inherent capacitive coupling to the power and ground and switch resistance. However, LS circuit 1111, AA filter 1110, S&H 1112, and Mux 1113 may be used with much less impact to system noise levels when implemented after the differential module 1101 of the AFE channel driver circuit 1100.

Figure 12:
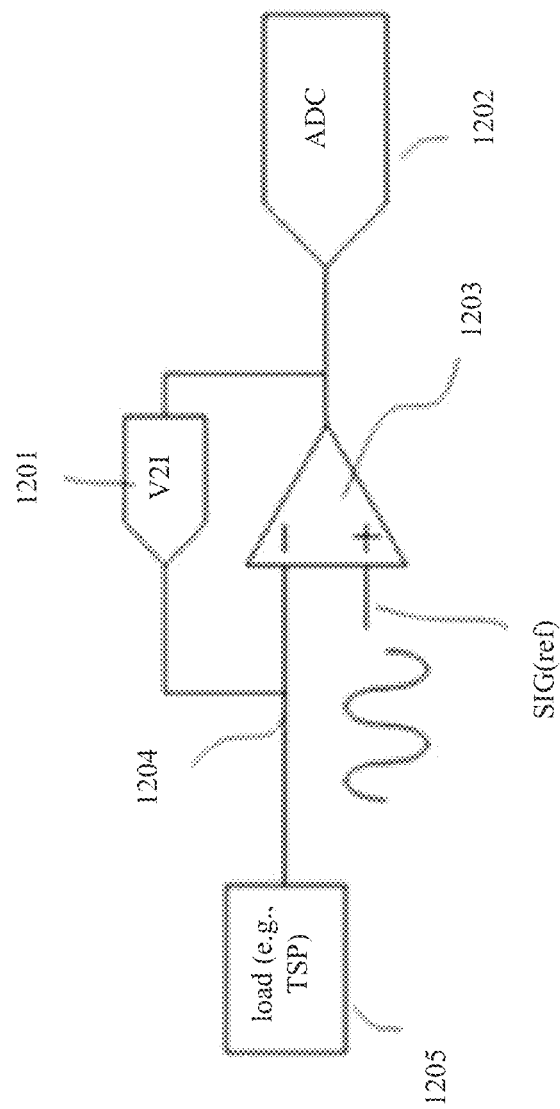
FIG. 12 is a schematic block diagram of another embodiment of an AFE channel driver circuit in accordance with the present invention.

FIG. 12 is a schematic block diagram of another embodiment of an AFE channel driver circuit in accordance with the present invention. In addition to the detailed embodiments described above, various other AFE circuit configurations may be implemented in alternative embodiments as may be desired. For example, this diagram shows a simplified diagram of a single ended AFE channel driver showing the main elements V2I 1201 and Difference Amplifier 1203, with current driving the load (e.g., a channel load touch screen panel (TSP) 1205) through node 1204, and ADC 1202.

Figure 13:
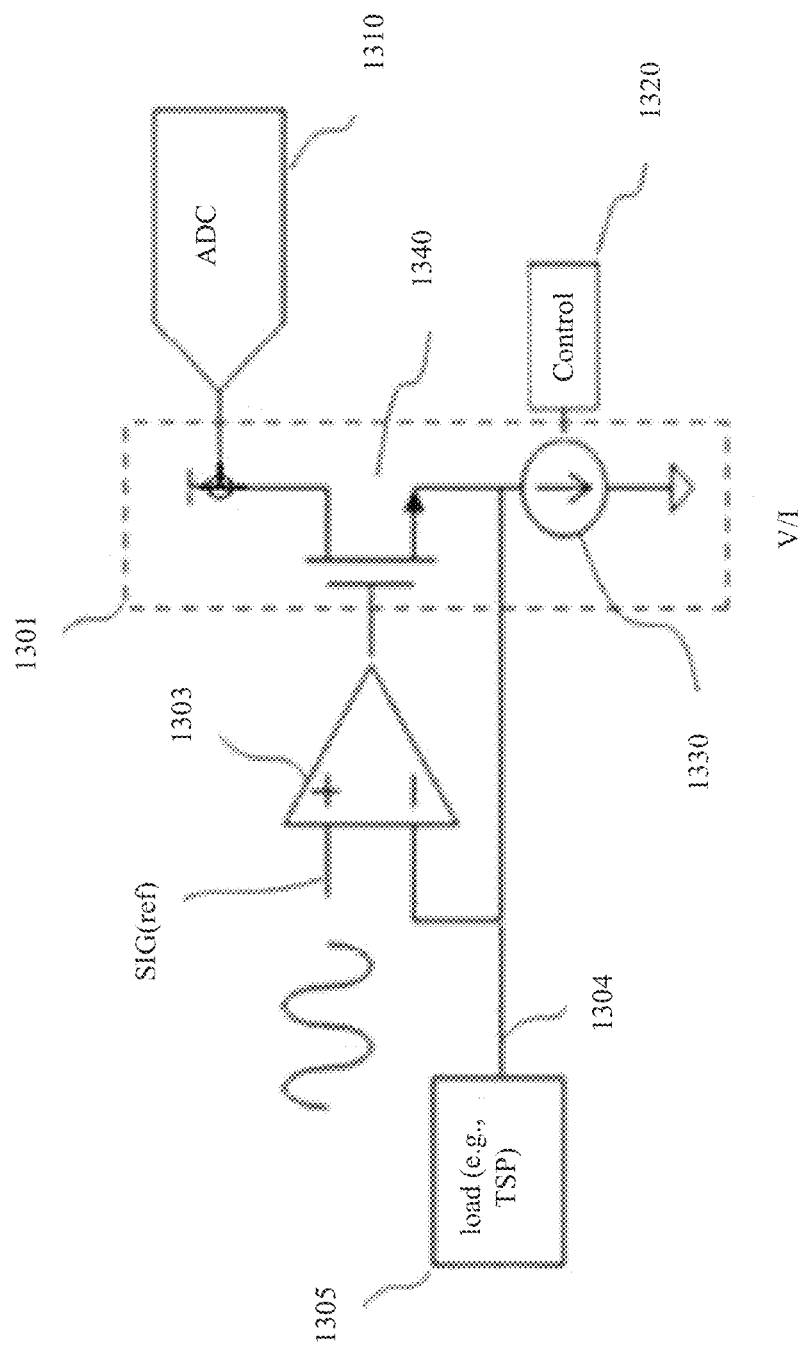
FIG. 13 is a schematic block diagram of another embodiment of an AFE channel driver circuit in accordance with the present invention.

FIG. 13 is a schematic block diagram of another embodiment of an AFE channel driver circuit in accordance with the present invention. This diagram provides an alternate AFE implementation that provides a way to modulate a TSP load 1305 with a V/I converter 1301 and difference amplifier 1303 and receive the capacitive change in the TSP 1305 via a current sensing technique. The sensed current is fed to the ADC 1310, and the ADC process the sensed current and provides a digitized measurement of the sensed current. The V/I converter 1301 includes a simple current sink 1330 and transistor 1340. Current may be sourced or sunk with some level of current and impedance control with control 1320 adjusting the strength of the current flow.

Figure 14:
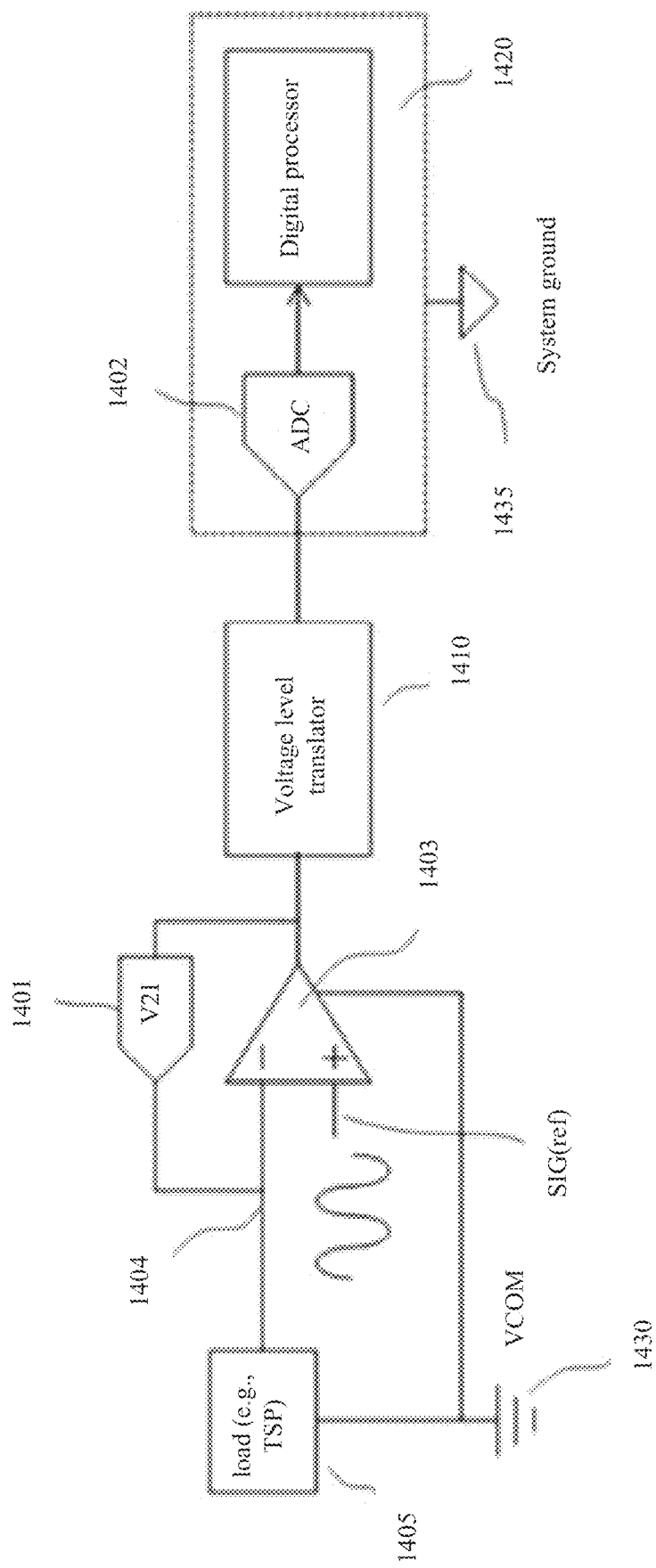
FIG. 14 is a schematic block diagram of embodiment of an AFE channel driver circuit with voltage level translation in accordance with the present invention.

FIG. 14 is a schematic block diagram of embodiment of an AFE channel driver circuit with voltage level translation in accordance with the present invention. This diagram provides a level translation circuit may be used to correct differences in the sensed voltage between two differing ground reference circuits. The channel impedance TSP 1405 is driven by the AFE, primarily composed of a difference amplifier 1403 and a V2I 1401. The AFE ground VCOM 1430 can be set above or below the system ground 1435. The Voltage Level Translator 1410 is the level translation circuit and contains circuitry to send the sensed voltage to the ADC 1402 for digitization and further processing in the digital processor 1420. A first method for correcting differences is to AC couple the differential sensed signal. As VCOM moves up and down relative to the system ground, the voltage difference between VCOM and the System ground is stored in AC coupling caps. The sensed voltage remains unchanged between the differential signal. Therefore, there is no loss of information. A second method for correcting differences is to place a pair of resistors between the AFE and the ADC. The resistors will carry both the common mode current and differential current. The differential current contains the information, while the common mode current reflects the voltage difference between VCOM and the system ground. No information is lost in the differential current as VCOM moves relative to the system ground.

Figure 15:
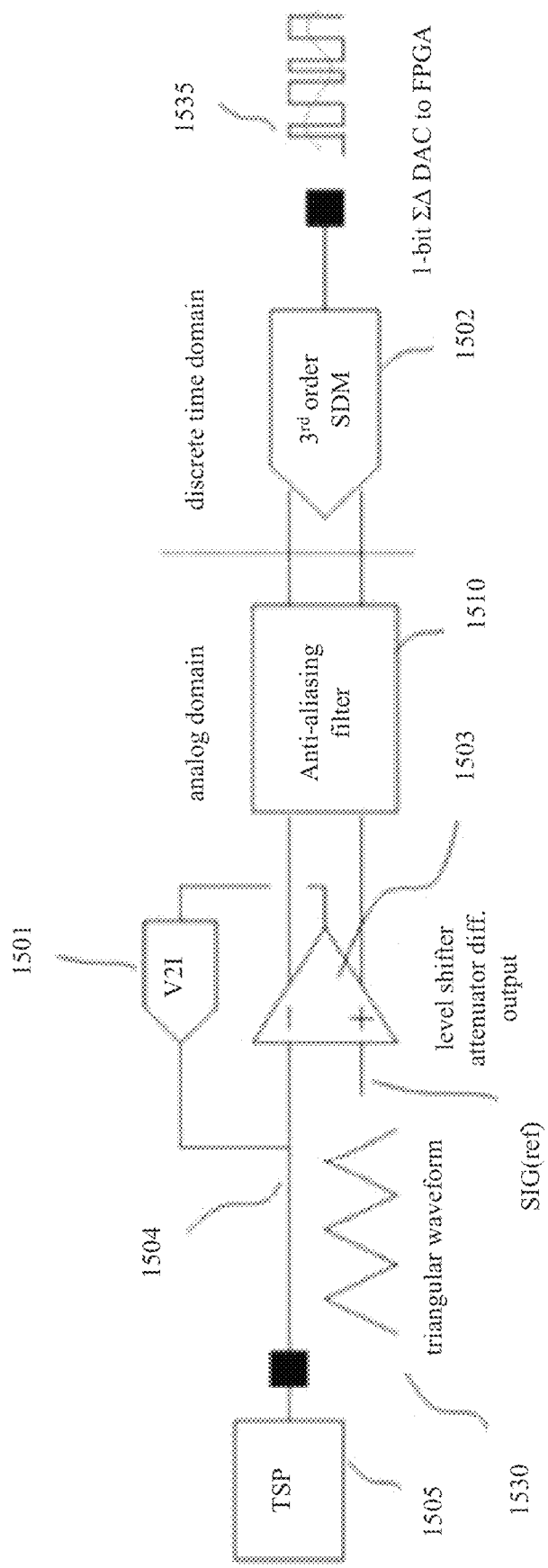
FIG. 15 is a schematic block diagram of embodiment of an AFE channel driver circuit operating with a low power triangle wave signal in accordance with the present invention.

FIG. 15 is a schematic block diagram of embodiment of an AFE channel driver circuit operating with a low power triangle wave signal in accordance with the present invention. In this diagram, an AFE system includes a differential output circuit 1503 performing the additional functions of a level shifter and attenuator, and a V2I feedback circuit 1501 measuring the analog error of a signal driven onto the TSP 1505 via connection node 1504. The connection node 1504 is also coupled to the second input of the differential output circuit 1503 and substantially similar to the triangular signal 1530 coupled to the first input of the differential output circuit 1503, which may be produced via a simple low power analog signal generation technique. The triangular waveform reference signal 1530 can be as simple as a current source charging/discharging a capacitor using an input square wave controlling the switching of a current source to generate a triangular waveform. The use of a triangular waveform 1530 also reduces the slewing of the error amplifier in the difference module 1503 and therefore results in lower power consumption. Further, two or more triangular wave forms may be added in the analog domain to generate a multi-tone reference signal.

The use of triangular waveforms instead of arbitrary signals to completely remove the sigma-delta modulator (SDM) driver with the associated quantization noise may help improve the system noise floor. A SDM modulator may be used to create AFE reference signals (SIG (ref)) but can add quantization noise to the system and require digital processing and filtering to remove the shaped noise both requiring extra power dissipation in the system. Further, the digital system may be used to generate square waves (50% duty cycle) with different frequencies. These square waves will be converted to triangular waveforms in the analog domain. For example, by a square wave controlling two current sources to charge/discharge a capacitor. In various embodiments, using a 50% duty cycle square wave eliminates the 2nd harmonic. The 3rd harmonic will be out of the signal band and may be filtered if necessary. In addition, the triangular waveform can be made very stable in an application-specific integrated circuit (ASIC) design. In various embodiments, the differential analog error signal output from the differential output circuit 1503 is coupled to a differential anti-aliasing filter 1510, such that the high frequency components are removed before the differential signal goes to the input of a differential sigma-delta ADC 1502. The output of the differential sigma-delta ADC 1503 is a digitally modulated shaped noise data stream 1535.

In accordance with various embodiments, the AFE channel driver circuit may be manufactured on an ASIC separately or as part of a complete system. A system of AFE with or without back end ADC may be used as a separate component connected to other ASIC systems or FPGA systems for digital back end processing and control.

With respect to the various embodiments described above, an AFE channel driver circuit has the ability, and by default operates in a state of "concurrent modality" such as providing signals at one or more frequencies to an analog I/O, monitoring the response of the driven signals to modification of the channel's impedance characteristics, and simultaneously receiving one or more externally generated signal frequencies coupled into the channel. In various embodiments, the AFE channel driver circuit operates with concurrent modality by driving a low impedance virtualized version of the first frequencies to the load in a first mode, simultaneously operating to sense said virtual first frequencies properties and change due to impedance variation in the load in a second mode, and simultaneously sensing one or more second frequencies injected into the load different from the first frequencies in a third mode. Further, in a touchscreen operation, one or more AFE channel driver circuit are configured for parallel communicating transmit/receive signals for mutual capacitance operation with one or more rows or columns transmitting (using at least one frequency per line) continuously and one or more rows or columns receiving continuously.

The AFE channel driver circuit may operate in a continuous manner or may be dropped into different low power states to reduce analog or digital power. Reduction of sampling clocks, deactivation of channels, reduction of output voltage or specific tones are but a few possible options.

Note that an AFE channel driver circuit, such as an AFE channel driver circuit or system such as with reference to FIG. 5 or any other diagrams herein or their equivalents, can be implemented using an ASIC or discrete components. For example, FPGA may be used for the digital processing of the AFE data stream after analog to digital conversion. In accordance with various embodiments, an AFE channel driver circuit is capable of very fast signal data transmission with simultaneous measurement of the impedance characteristics of the external load network.

In various embodiments, an AFE channel driver circuits may include a feedback impedance network, I/O impedance networks, resistive components, with variable or switched capacitor current shuttles with controllable frequency and duty cycle. The variable impedance of the driver module allows changes to gain (inverting and non-inverting gain) and drive impedance. Further, a switched power supply (with frequency and duty cycle control) or switched capacitor charge pump may be coupled to the V/I on the feedback loop such that high voltage can be used to increase voltage overhead necessary due to gain or to increase the output signal driven onto the analog device. In some embodiments, the rails of the differential amplifiers, comparator, and switches will also have high voltage rails. The SIG (ref) filter (e.g., LPF 1114 of FIG. 11) can be a filter of low to high order as required to remove generator noise. In various embodiments, the differential module can be replaced with a differential amplifier having good power supply ripple rejection (PSRR) and electrostatic discharge (ESD) protection, with high input impedance and low bias current.

Figure 16:
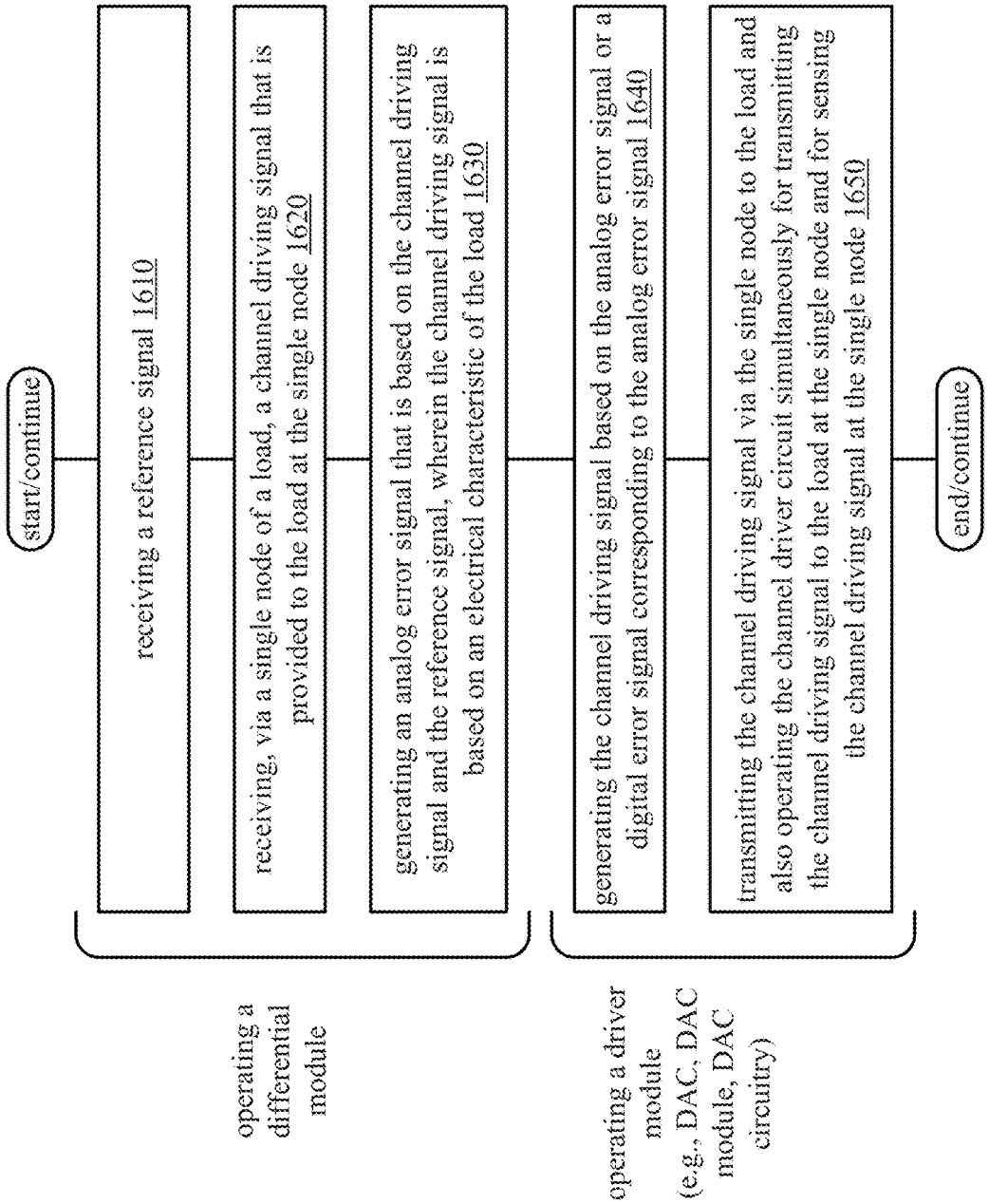
FIG. 16 is a schematic block diagram of an embodiment of a method for execution by one or more devices in accordance with the present invention.

FIG. 16 is a schematic block diagram of an embodiment of a method 1600 for execution by one or more devices in accordance with the present invention. The method 1600 operates by operating a differential module in step 1610 by receiving a reference signal. The method 1600 also operates by operating the differential module in step 1620 by receiving, via a single node of a load, a channel driving signal that is provided to the load at the single node. The method 1600 also operates by operating the differential module in step 1630 by generating an analog error signal that is based on the channel driving signal and the reference signal. Note that the channel driving signal is based on an electrical characteristic of the load.

The method 1600 operates by operating a driver module in step 1640 by operating a driver module that is coupled to the differential module by generating the channel driving signal based on the analog error signal or a digital error signal corresponding to the analog error signal. The method 1600 also operates by operating the driver module in step 1650 by transmitting the channel driving signal via the single node to the load and also operating the channel driver circuit simultaneously for transmitting the channel driving signal to the load at the single node and for sensing the channel driving signal at the single node.

FIG. 17 is a schematic block diagram of another embodiment of a method 1700 for execution by one or more devices in accordance with the present invention. The method 1700 operates by operating a differential module in step 1710 by receiving a reference signal. The method 1700 also operates by operating the differential module in step 1720 by receiving, via a single node of a load, a channel driving signal that is provided to the load at the single node. The method 1700 also operates by operating the differential module in step 1730 by generating an analog error signal that is based on the channel driving signal and the reference signal. Note that the channel driving signal is based on an electrical characteristic of the load.

The method 1700 operates by operating a driver module in step 1740 by operating a driver module that is coupled to the differential module by generating the channel driving signal based on a digital error signal corresponding to the analog error signal. The method 1700 also operates by operating the driver module in step 1750 by transmitting the channel driving signal via the single node to the load and also operating the channel driver circuit simultaneously for transmitting the channel driving signal to the load at the single node and for sensing the channel driving signal at the single node.

The method 1700 operates by operating a sigma-delta module coupled to the differential module in step 1760 by receiving the analog error signal. The method 1700 also operates by operating the sigma-delta module in step 1770 by processing the analog error signal to generate the digital error signal corresponding to the analog error signal. The method 1700 also operates by operating the sigma-delta module in step 1780 by transmitting the digital error signal corresponding to the analog error signal to a computing device and/or processing circuitry to be processed in accordance with interpreting the digital error signal.

In addition, note that the one or more signals provided from any channel driver circuit as described herein, or their equivalents, may be of any of a variety of types. For example, such a signal may be based on encoding of one or more bits to generate one or more coded bits used to generate modulation data (or generally, data). For example, a device is configured to perform forward error correction (FEC) and/or error checking and correction (ECC) code of one or more bits to generate one or more coded bits. Examples of FEC and/or ECC may include turbo code, convolutional code, turbo trellis coded modulation (TTCM), low density parity check (LDPC) code, Reed-Solomon (RS) code, BCH (Bose and Ray-Chaudhuri, and Hocquenghem) code, binary convolutional code (BCC), Cyclic Redundancy Check (CRC), and/or any other type of ECC and/or FEC code and/or combination thereof, etc. Note that more than one type of ECC and/or FEC code may be used in any of various implementations including concatenation (e.g., first ECC and/or FEC code followed by second ECC and/or FEC code, etc. such as based on an inner code/outer code architecture, etc.), parallel architecture (e.g., such that first ECC and/or FEC code operates on first bits while second ECC and/or FEC code operates on second bits, etc.), and/or any combination thereof.

Also, the one or more coded bits may then undergo modulation or symbol mapping to generate modulation symbols (e.g., the modulation symbols may include data intended for one or more recipient devices, components, elements, etc.). Note that such modulation symbols may be generated using any of various types of modulation coding techniques. Examples of such modulation coding techniques may include binary phase shift keying (BPSK), quadrature phase shift keying (QPSK), 8-phase shift keying (PSK), 16 quadrature amplitude modulation (QAM), 32 amplitude and phase shift keying (APSK), etc., uncoded modulation, and/or any other desired types of modulation including higher ordered modulations that may include even greater number of constellation points (e.g., 1024 QAM, etc.).

In addition, note that a signal provided from any channel driver circuit as described herein, or their equivalents, may be of a unique frequency that is different from signals provided from other any channel driver circuits as described herein, or their equivalents. Also, a signal provided from any channel driver circuit as described herein, or their equivalents, may include multiple frequencies independently or simultaneously. The frequency of the signal can be hopped on a pre-arranged pattern. In some examples, a handshake is established between one or more any channel driver circuits as described herein, or their equivalents, and one or more processing module (e.g., one or more controllers) such that the one or more any channel driver circuit/s as described herein, or their equivalents, is/are directed by the one or more processing modules regarding which frequency or frequencies and/or which other one or more characteristics of the one or more signals to use at one or more respective times and/or in one or more particular situations.

With respect to any signal that is driven and simultaneously detected by any channel driver circuit as described herein, or their equivalents, note that any additional signal that is coupled into a line, an electrode, a touch sensor, a bus, a communication link, an electrical coupling or connection, etc. associated with that channel driver circuit as described herein, or their equivalents, is also detectable. For example, any channel driver circuit as described herein, or their equivalents, that is associated with such a line, an electrode, a touch sensor, a bus, a communication link, an electrical coupling or connection, etc. is configured to detect any signal from one or more other lines, electrodes, a touch sensors, a buses, a communication links, electrical couplings or connections, etc. that get coupled into that line, electrode, touch sensor, bus, communication link, electrical coupling or connection, etc.

Note that the different respective signals that are driven and simultaneously sensed by one or more any channel driver circuits as described herein, or their equivalents, may be are differentiated from one another. Appropriate filtering and processing can identify the various signals given their differentiation, orthogonality to one another, difference in frequency, etc. Other examples described herein and their equivalents operate using any of a number of different characteristics other than or in addition to frequency.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provide an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A channel driver circuit comprising:
   a differential module configured to:
   receive a reference signal;
   receive, via a single node of a load, a channel driving signal that is provided to the load at the single node; and
   generate an analog error signal that is based on the channel driving signal and the reference signal, wherein the channel driving signal is based on an electrical characteristic of the load; and
   a driver module that is coupled to the differential module and configured to:
   generate the channel driving signal based on the analog error signal or a digital error signal corresponding to the analog error signal; and
   transmit the channel driving signal via the single node to the load, wherein the channel driver circuit is configured simultaneously to transmit the channel driving signal to the load at the single node and to sense the channel driving signal at the single node.

2. The channel driver circuit of claim 1 further comprising:
   a sigma-delta module coupled to the differential module and configured to:
   receive the analog error signal;
   process the analog error signal to generate the digital error signal corresponding to the analog error signal; and
   transmit the digital error signal corresponding to the analog error signal to at least one of a computing device or processing circuitry to be processed in accordance with interpreting the digital error signal.

3. The channel driver circuit of claim 2, wherein:
   the differential module includes a differential amplifier having a first input port configured to receive the channel driving signal, a second input port configured to receive the reference signal, and an output port configured to output the analog error signal;
   the sigma-delta module includes an analog to digital converter (ADC) configured to process the analog error signal to generate the digital error signal corresponding to the analog error signal; and
   the driver module includes a digital to analog converter (DAC) configured to generate the channel driving signal based on the digital error signal corresponding to the analog error signal.

4. The channel driver circuit of claim 2, wherein the sigma-delta module includes:
   a comparator configured to receive the analog error signal and to process the analog error signal to generate the digital error signal corresponding to the analog error signal; and
   a flip-flop circuit configured to store the digital error signal at least temporarily before transmitting the digital error signal corresponding to the analog error signal to the at least one of the computing device or the processing circuitry to be processed in accordance with interpreting the digital error signal.

5. The channel driver circuit of claim 1 further comprising:
   a filter configured to process the analog error signal in accordance with at least one of anti-aliasing filtering or pass band limiting to generate a filter signal; and an analog to digital converter (ADC) configured to:
  process the analog error signal to generate the digital error signal corresponding to the analog error signal; and
  transmit the digital error signal corresponding to the analog error signal to at least one of a computing device or processing circuitry to be processed in accordance with interpreting the digital error signal corresponding to the analog error signal.

6. The channel driver circuit of claim 1, wherein:
the differential module includes a differential amplifier having a first input port configured to receive the channel driving signal, a second input port configured to receive the reference signal via a resistor, and an output port that is coupled to the second input port via at least one of another resistor or a capacitor and is configured to output the analog error signal, wherein the analog error signal is output from the differential amplifier as a single-ended analog error signal or a differential analog error signal.

7. The channel driver circuit of claim 1, wherein:
the driver module includes a voltage to current converter circuitry configured to generate the channel driving signal based on the analog error signal or the digital error signal corresponding to the analog error signal.

8. The channel driver circuit of claim 1, wherein the load includes an electrode of a touchscreen, a sensor, a transducer, a device, an integrated circuit, circuitry, a computer, a tablet, a smart phone, an appliance, or a motor.

9. A channel driver circuit comprising:
a differential module configured to:
  receive a reference signal;
  receive, via a single node of a load, a channel driving signal that is provided to the load at the single node; and
  generate an analog error signal that is based on the channel driving signal and the reference signal, wherein the channel driving signal is based on an electrical characteristic of the load; and
a driver module that is coupled to the differential module and configured to:
  generate the channel driving signal based on a digital error signal corresponding to the analog error signal; and
  transmit the channel driving signal via the single node to the load, wherein the driver module includes a voltage to current converter circuitry configured to generate the channel driving signal based on the digital error signal corresponding to the analog error signal; and
a sigma-delta module coupled to the differential module and configured to:
  receive the analog error signal;
  process the analog error signal to generate the digital error signal corresponding to the analog error signal; and
  transmit the digital error signal corresponding to the analog error signal to at least one of a computing device or processing circuitry to be processed in accordance with interpreting the digital error signal corresponding to the analog error signal, wherein the channel driver circuit is configured simultaneously to transmit the channel driving signal to the load at the single node and to sense the channel driving signal at the single node.

10. The channel driver circuit of claim 9, wherein:
the differential module includes a differential amplifier having a first input port configured to receive the channel driving signal, a second input port configured to receive the reference signal, and an output port configured to output the analog error signal;
the sigma-delta module includes an analog to digital converter (ADC) configured to process the analog error signal to generate the digital error signal corresponding to the analog error signal; and
the driver module includes a digital to analog converter (DAC) configured to generate the channel driving signal based on the digital error signal corresponding to the analog error signal.

11. The channel driver circuit of claim 9, wherein the sigma-delta module includes:
a comparator configured to receive the analog error signal and to process the analog error signal to generate the digital error signal corresponding to the analog error signal; and
a flip-flop circuit configured to store the digital error signal at least temporarily before transmitting the digital error signal corresponding to the analog error signal to the at least one of the computing device or the processing circuitry to be processed in accordance with interpreting the digital error signal.

12. The channel driver circuit of claim 9, wherein:
the differential module includes a differential amplifier having a first input port configured to receive the channel driving signal, a second input port configured to receive the reference signal via a resistor, and an output port that is coupled to the second input port via at least one of another resistor or a capacitor and is configured to output the analog error signal, wherein the analog error signal is output from the differential amplifier as a single-ended analog error signal or a differential analog error signal.

13. The channel driver circuit of claim 9, wherein the load includes an electrode of a touchscreen, a sensor, a transducer, a device, an integrated circuit, circuitry, a computer, a tablet, a smart phone, an appliance, or a motor.

14. A method for execution by a channel driver circuit comprising:
operating a differential module for:
  receiving a reference signal;
  receiving, via a single node of a load, a channel driving signal that is provided to the load at the single node; and
  generating an analog error signal that is based on the channel driving signal and the reference signal, wherein the channel driving signal is based on an electrical characteristic of the load; and
operating a driver module that is coupled to the differential module for:
  generating the channel driving signal based on the analog error signal or a digital error signal corresponding to the analog error signal; and
  transmitting the channel driving signal via the single node to the load and also operating the channel driver circuit simultaneously for transmitting the channel driving signal to the load at the single node and for sensing the channel driving signal at the single node.

15. The method of claim 14 further comprising:
operating a sigma-delta module coupled to the differential module for:
  receiving the analog error signal;
  processing the analog error signal to generate the digital error signal corresponding to the analog error signal; and transmitting the digital error signal corresponding to the analog error signal to at least one of a computing device or processing circuitry to be processed in accordance with interpreting the digital error signal.

16. The method of claim 15, wherein:

the differential module includes a differential amplifier having a first input port configured to receive the channel driving signal, a second input port configured to receive the reference signal, and an output port configured to output the analog error signal;

the sigma-delta module includes an analog to digital converter (ADC) configured to process the analog error signal to generate the digital error signal corresponding to the analog error signal; and the driver module includes a digital to analog converter (DAC) configured to generate the channel driving signal based on the digital error signal corresponding to the analog error signal.

17. The method of claim 15, wherein the sigma-delta module includes:

a comparator configured to receive the analog error signal and to process the analog error signal to generate the digital error signal corresponding to the analog error signal; and a flip-flop circuit configured to store the digital error signal at least temporarily before transmitting the digital error signal corresponding to the analog error signal to the at least one of the computing device or the processing circuitry to be processed in accordance with interpreting the digital error signal.

18. The method of claim 14 further comprising:

operating a filter configured for processing the analog error signal in accordance with at least one of anti-aliasing filtering or pass band limiting for generating a filter signal; and operating an analog to digital converter (ADC) for:

processing the analog error signal to generate the digital error signal corresponding to the analog error signal; and transmitting the digital error signal corresponding to the analog error signal to at least one of a computing device or processing circuitry to be processed in accordance with interpreting the digital error signal corresponding to the analog error signal.

19. The method of claim 14, wherein:

the differential module includes a differential amplifier having a first input port configured to receive the channel driving signal, a second input port configured to receive the reference signal via a resistor, and an output port that is coupled to the second input port via at least one of another resistor or a capacitor and is configured to output the analog error signal, wherein the analog error signal is output from the differential amplifier as a single-ended analog error signal or a differential analog error signal.

20. The method of claim 14, wherein:

the driver module includes a voltage to current converter circuitry configured to generate the channel driving signal based on the analog error signal or the digital error signal corresponding to the analog error signal.

* * * * *